(12) United States Patent
Dummermuth et al.

(10) Patent No.: US 6,593,870 B2
(45) Date of Patent: Jul. 15, 2003

(54) MEMS-BASED ELECTRICALLY ISOLATED ANALOG-TO-DIGITAL CONVERTER

(75) Inventors: Ernst H. Dummermuth, Chesterland, OH (US); Michael J. Knieser, Richmond Heights, OH (US); Patrick C. Herbert, Mentor, OH (US); Jeffrey R. Annis, Waukesha, WI (US); Steven M. Galecki, Concord, OH (US); Richard D. Harris, Solon, OH (US); Mark A. Lucak, Hudson, OH (US); Robert J. Kretschmann, Bay Village, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/982,726

(22) Filed: Oct. 18, 2001

(65) Prior Publication Data

US 2003/0076249 A1 Apr. 24, 2003

(51) Int. Cl.$^7$ .............................. H03M 1/00; H03M 1/12
(52) U.S. Cl. ........................ 341/155; 438/52; 341/143
(58) Field of Search ............................... 341/155, 143; 310/307, 306; 333/262; 438/52

(56) References Cited

U.S. PATENT DOCUMENTS

| | | | |
|---|---|---|---|
| 5,578,976 A | 11/1996 | Yao | 333/262 |
| 5,761,350 A | 6/1998 | Koh | 385/14 |
| 5,783,340 A | 7/1998 | Farino et al. | 430/22 |
| 5,804,314 A | 9/1998 | Field et al. | 428/402 |
| 5,903,380 A | 5/1999 | Motamedi et al. | 359/224 |
| 5,959,516 A | 9/1999 | Chang et al. | 334/14 |
| 5,995,688 A | 11/1999 | Aksyuk et al. | 385/14 |
| 6,035,694 A | * 3/2000 | Dupuie et al. | 73/1.38 |
| 6,046,066 A | 4/2000 | Fang et al. | 438/52 |
| 6,071,426 A | 6/2000 | Lee et al. | 216/24 |
| 6,094,102 A | 7/2000 | Chang et al. | 331/17 |
| 6,100,477 A | 8/2000 | Randall et al. | 200/181 |
| 6,114,794 A | 9/2000 | Dhuler et al. | 310/307 |
| 6,137,206 A | 10/2000 | Hill | 310/306 |
| 6,159,385 A | 12/2000 | Yao et al. | 216/2 |
| 6,188,322 B1 | 2/2001 | Yao et al. | 340/664 |
| 6,232,841 B1 | 5/2001 | Bartlett et al. | 330/305 |
| 6,232,847 B1 | 5/2001 | Marcy, 5th et al. | 331/167 |

(List continued on next page.)

OTHER PUBLICATIONS

Toumazou, C. et al., n–step Charge Injection Cancellation Scheme for Very Accurate Switched Current Circuits, Electronic Letters, V.30 (9) 680–681: 1994.

Emmerich, H., et al., A Novel Micromachined Magnetic–Field Sensor, MEMS 99 IEEE Conference, Jan. 17–21, 1999, IEEE Catalog No. 99ch36291c.

Madou, Marc, Fundamentals of Microfabrication, Chapters 2–4, CRC Press LLC, Boca Raton, FL: 1997.

(List continued on next page.)

*Primary Examiner*—Peguy JeanPierre
(74) *Attorney, Agent, or Firm*—Quarles & Brady; Alexander M. Gerasimow; William R. Walbrun

(57) ABSTRACT

An isolated-ADC and a method for providing isolated analog-to-digital conversion are disclosed. The isolated-ADC includes a microelectromechanical system (MEMS), a comparator, and a digital-to-analog converter (DAC). The MEMS includes a beam element supported from a substrate for movement with respect to an axis, first and second actuators and a sensor. The first and second actuators are capable of exerting respective forces upon the beam element causing the beam element to move in response to analog input and feedback signals, respectively. The sensor detects changes in position of the beam element and produces a position signal indicative thereof. The comparator generates a digital signal based upon a comparison of the position signal with a reference value. Based on the digital signal, the DAC generates the feedback signal, and the isolated-ADC produces a digital output signal.

79 Claims, 6 Drawing Sheets

U.S. PATENT DOCUMENTS

| | | | |
|---|---|---|---|
| 6,348,788 B1 * | 2/2002 | Yao et al. | 324/99 R |
| 6,411,214 B1 * | 6/2002 | Yao et al. | 340/664 |
| 6,417,743 B1 * | 7/2002 | Mihailovich et al. | 327/538 |
| 6,463,339 B1 * | 10/2002 | Vasko | 700/18 |
| 6,466,005 B1 * | 10/2002 | Yao et al. | 324/117 R |
| 6,504,356 B2 * | 1/2003 | Yao et al. | 324/99 R |

OTHER PUBLICATIONS

Kovacs, Gregory T.A., Micromachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectromechanical Sys., V.4(4) 220–229, Dec. 1995.

Lu, Crist et al., A Monolithic Surface Micromachined Accelerometer with Digital Output, IEEE J. of Solid State Circuits, V. 30 (12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, Mark A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gerardo, Sigma–Delta A/D Converters–Audio and Medium Bandwidths, Technical Notes–DT3 from RMS Instruments website: www.rmsinst.com, 6 pages, Feb. 1996.

Internet page: Decimator Filter DLL, NeuroDimension Inc.: www.nd.com, May 31, 2001.

* cited by examiner

MEMS-BASED ELECTRICALLY ISOLATED ANALOG-TO-DIGITAL CONVERTER

CROSS-REFERENCE TO RELATED APPLICATIONS

FIELD OF THE INVENTION

The present invention relates to electrical isolators and in particular to electrical isolators that employ microelectromechanical system (MEMS) devices.

BACKGROUND OF THE INVENTION

Electrical isolators are used to provide electrical isolation between circuit elements for the purposes of voltage level shifting, electrical noise reduction, and high voltage and current protection. Circuit elements can be considered electrically isolated if there is no path in which a direct current (DC) can flow between them. Isolation of this kind can be obtained by capacitive or inductive coupling. In capacitive coupling, an electrical input signal is applied to one plate of a capacitor to transmit an electrostatic signal across an insulating dielectric to a second plate at which an output signal is developed. In inductive coupling, an electrical input signal is applied to a first coil to transmit an electromagnetic field across an insulating gap to a second coil, which generates the isolated output signal.

Both such isolators essentially block steady state or DC electrical signals. Such isolators, although simple, block the communication of signals that have significant low frequency components. Further, these isolators can introduce significant frequency dependent attenuation and phase distortion in the transmitted signal. These features make such isolators unsuitable for many types of signals including many types of high-speed digital communications.

In addition, it is sometimes desirable to provide high voltage (>2 kV) isolation between two different portions of a system, while maintaining a communication path between these two portions. This is often true in industrial control applications where it is desirable to isolate the sensor/actuator portions from the control portions of the overall system. It is also applicable to medical instrumentation systems, where it is desirable to isolate the patient from the voltages and currents within the instrumentation.

The isolation of digital signals is frequently provided by optical isolators. In an optical isolator, an input signal drives a light source, typically a light emitting diode (LED) positioned to transmit its light to a photodiode or phototransistor through an insulating but transparent separator. Such a system will readily transmit a binary signal of arbitrary frequency without the distortion and attenuation introduced by capacitors and inductors. The optical isolator further provides an inherent signal limiting in the output through saturation of the light receiver, and signal thresholding in the input, by virtue of the intrinsic LED forward bias voltage.

Nevertheless, optical isolators have some disadvantages. They require a relatively expensive gallium arsenide (GaAs) substrate that is incompatible with other types of integrated circuitry and thus optical isolators often require separate packaging and assembly from the circuits they are protecting. The characteristics of the LED and photodetector can be difficult to control during fabrication, increasing the costs if unit-to-unit variation cannot be tolerated. The power requirements of the LED may require signal conditioning of the input signal before an optical isolator can be used, imposing yet an additional cost. While the forward bias voltage of the LED provides an inherent noise thresholding, the threshold generally cannot be adjusted but is fixed by chemical properties of the LED materials. Accordingly, if different thresholds are required, additional signal conditioning may be needed. Additionally, the LED is a diode and thus limits the input signal to a single polarity unless multiple LEDs are used.

Further, optical isolators are not well suited for the isolation of analog signals. Optical isolators can only operate to isolate analog signals in one of two ways. One of these is to operate the LED of the optical isolator in its linear range, so that the output signal of the optical isolator accurately reflects the input signal. Maintaining the operation of the LED in its linear range is difficult to do consistently (as is the calibration required to determine what is the LED's linear range). The second way of isolating analog signals is to digitize the analog signal and transmit the digitized bits with multiple optical isolators. Multiple isolators, however, are expensive and bulky and the need to preprocess the input analog signal requires a significant amount of electronics.

Other technologies also exist or are being developed that can be employed to isolate digital and analog signals. For example, U.S. patent application Ser. No. 09/788,928 filed on Feb. 20, 2001, which is hereby incorporated by reference, discloses a mechanical isolator that is manufactured using MEMS techniques and suitable for transmitting digital signals. Similarly, U.S. patent application Ser. No. 09/804,817 filed on Mar. 13, 2001, also hereby incorporated by reference, discloses a MEMS isolator suitable for transmitting analog signals. In each case, the isolator uses a specially fabricated microscopic beam supported on a substrate and whose ends are insulated from each other. One end of the beam is connected to a microscopic actuator, which receives an input signal to move the beam against a biasing force provided by a biasing device. The other end of the beam is attached to a sensor detecting movement of the beam. For the digital isolator, the biasing force is constant, and beam movement occurs only when the input signal is sufficient to overcome the biasing force.

Although such MEMS devices can provide signal isolation, the devices by themselves cannot be implemented as isolated analog-to-digital converters (isolated-ADCs). To the extent such MEMS devices are employed as isolated analog-to-analog converters, the output of the devices can be converted into digital format by the addition of a conventional analog-to-digital conversion circuit, thus producing isolated-ADCs. However, the addition of this circuit adds to the expense of the MEMS devices. Further, while it is possible to design converters that operate open-loop, closed-loop converters are preferable in order to maintain desired linear operation of the converters over a relatively large range of possible input signals. Consequently, designing isolated-ADCs using conventional MEMS devices that are employed as isolated analog-to-analog converters not only requires that conventional analog-to-digital conversion circuits be provided at the output of the MEMS devices, but also requires feedback circuitry such as a proportional-integral control circuit. Because the feedback circuitry, conventional analog-to-digital conversion circuitry and MEMS devices are typically physically located on different microchips, the costs associated with designing and constructing isolated-ADCs by way of these conventional devices is further increased.

Therefore, it would be desirable if a new isolated-ADC that employed a MEMS device was developed, where the new isolated-ADC employed simpler, less costly and more easily manufactured circuitry.

BRIEF SUMMARY OF THE INVENTION

The present invention provides a microelectromechanical system (MEMS) circuit in which the MEMS device forms part of a sigma-delta converter. The converter provides stability, a simplified design, and a digitized output such that the circuit acts as an isolated analog-to-digital converter (isolated-ADC) with a digital output that can be used for later computerized processing.

Generally, an analog signal that is input to the MEMS device is converted into a force applied to a beam within the MEMS device. Also applied to the beam is a feedback signal. The combined forces upon the beam move the beam with respect to a sensor, which outputs a signal indicative of the position of the beam. The signal is compared with a reference value representative of a reference position of the beam, and the result of the comparison is provided as a digital signal that is used to generate the output signal as well as the feedback signal.

In particular, the present invention relates to an isolated-ADC providing isolation between an analog input signal and a digital output signal. The isolated-ADC includes a microelectromechanical system (MEMS), a comparator, and a digital-to-analog converter (DAC). The MEMS includes a substrate, a beam element supported from the substrate for movement with respect to an axis relative to the substrate, and a first actuator attached to the beam element, where the first actuator is capable of exerting a first force upon the beam element causing the beam element to move with respect to the axis, and where the first force is dependent upon the analog input signal provided to the isolated-ADC. The MEMS further includes a sensor communicating with the beam element to detect a change in position of the beam element and to produce a position signal indicative of the position of the beam element, and a second actuator attached to the beam element, where the second actuator is capable of exerting a second force upon the beam element based upon a feedback signal. The comparator is electrically coupled to the sensor, and generates a digital signal based upon a comparison of the position signal with a reference value representative of a reference position of the beam element. The DAC is electrically coupled between the second actuator and the comparator, and generates the feedback signal at least in partial dependence upon the digital signal. The digital output signal is further produced by a processing device within the isolated-ADC in dependence upon the digital signal, the digital output signal being an indication of, and electrically isolated from, the analog input signal.

The present invention further relates to an isolated-ADC providing isolation between an analog input signal and a digital output signal. The isolated-ADC includes a microelectromechanical system (MEMS), a comparator, and a differentiator. The MEMS includes a substrate, a beam element supported from the substrate for movement with respect to an axis relative to the substrate, and a first actuator attached to the beam element. The first actuator is capable of exerting a first force upon the beam element causing the beam element to move with respect to the axis, and the first force is dependent upon the analog input signal provided to the isolated-ADC. The MEMS further includes a sensor communicating with the beam element to detect a change in position of the beam element and to produce a position signal indicative of the position of the beam element, and a second actuator attached to the beam element, where the second actuator is capable of exerting a second force upon the beam element based upon a feedback signal. The comparator is electrically coupled to the sensor, and generates a digital signal based upon a comparison of the position signal with a reference value representative of a reference position of the beam element. The differentiator is electrically coupled to the comparator, and generates an intermediate signal related to a derivative of the digital signal. The first feedback signal includes at least one of a first analog signal component based upon the intermediate signal and a second analog signal component based upon the digital signal. The digital output signal is further produced by a processing device within the isolated-ADC in dependence upon the digital signal, the digital output signal being an indication of, and electrically isolated from, the analog input signal.

The present invention further relates to an isolated-ADC providing isolation between an analog input signal and a digital output signal. The isolated-ADC includes a microelectromechanical system (MEMS), a set of comparators, a logical decision device, and a digital-to-analog converter (DAC). The MEMS includes a substrate, a beam element supported from the substrate for movement with respect to an axis relative to the substrate, and a first actuator attached to the beam element, where the first actuator is capable of exerting a first force upon the beam element causing the beam element to move with respect to the axis, and where the first force is dependent upon the analog input signal provided to the isolated-ADC. The MEMS further includes a sensor communicating with the beam element to detect a change in position of the beam element and to produce a position signal indicative of the position of the beam element, and a second actuator attached to the beam element, where the second actuator is capable of exerting a second force upon the beam element based upon a feedback signal. The set of comparators includes at least first, second and third comparators that are each electrically coupled to the sensor, where the first comparator generates a first digital signal based upon a comparison of the position signal with a reference value representative of a reference position of the beam element, the second comparator generates a second digital signal based upon a comparison of the position signal with a first offset value representative of a first reference position offset of the beam element, and the third comparator generates a third digital signal based upon a comparison of the position signal with a second offset value representative of a second reference position offset of the beam element. The logical decision device is coupled to the first, second and third comparators, and generates a feedback bitstream signal that is based on at least the first, second and third digital signals. The DAC is electrically coupled between the second actuator and the logical decision device, and generates the feedback signal in dependence upon the feedback bitstream signal. The digital output signal is further produced by the isolated-ADC in dependence upon at least one of the first, second and third digital signals, the digital output signal being an indication of, and electrically isolated from, the analog input signal.

The present invention additionally relates to an isolated-ADC providing isolation between an analog input signal and a digital output signal. The isolated-ADC includes a microelectromechanical system (MEMS), a differential amplifier, a comparator bias circuit, and a digital-to-analog converter (DAC). The MEMS includes a substrate, a beam element supported from the substrate for movement with respect to an axis relative to the substrate, and a first actuator attached to the beam element, where the first actuator is capable of exerting a first force upon the beam element causing the beam element to move with respect to the axis, and where the first force is dependent upon the analog input signal provided to the isolated-ADC. The MEMS further includes a sensor communicating with the beam element to detect a change in position of the beam element and to produce a position signal indicative of the position of the beam element, and a second actuator attached to the beam element, where the second actuator is capable of exerting a second force upon the beam element based upon a feedback signal. The differential amplifier is electrically coupled to the sensor, and generates two intermediate signals based upon a comparison of the position signal with a reference value representative of a reference position of the beam element. The comparator bias circuit includes a comparator that receives the two intermediate signals and in response generates a digital signal. The DAC is electrically coupled between the second actuator and the comparator bias circuit, and generates the feedback signal dependent upon the digital signal. The digital output signal is further produced by the isolated-ADC in dependence upon the digital signal, the digital output signal being an indication of, and electrically isolated from, the analog input signal.

The present invention further relates to an isolated-ADC providing isolation between an analog input signal and a digital output signal. The isolated-ADC includes a microelectromechanical system (MEMS), a first comparator and a digital-to-analog converter (DAC). The MEMS includes a substrate, a beam element supported from the substrate for movement with respect to an axis relative to the substrate, and a first actuator attached to the beam element, where the first actuator is capable of exerting a first force upon the beam element causing the beam element to move with respect to the axis, and where the first force is dependent upon the analog input signal provided to the isolated-ADC. The MEMS further includes a sensor communicating with the beam element to detect a change in position of the beam element and to produce a position signal indicative of the position of the beam element, a second actuator attached to the beam element, where the second actuator is capable of exerting a second force upon the beam element based upon a feedback signal, and a damping element coupled to the beam element, where the damping element tends to generate a third force when the beam element moves, the third force tending to counter the at least one of the first and second forces causing the movement. The first comparator is electrically coupled to the sensor, and generates a first digital signal based upon a comparison of the position signal with a reference value representative of a reference position of the beam element. The DAC is electrically coupled between the first comparator and the second actuator, and generates the feedback signal in dependence upon the first digital signal. The digital output signal is further produced by the isolated-ADC in dependence upon the first digital signal, the digital output signal being an indication of, and electrically isolated from, the analog input signal.

The present invention further relates to an isolated-ADC. The isolated-ADC includes a microelectromechanical means for adding an analog input signal to a feedback signal and producing a position signal in response to the analog input and feedback signals, and a means for generating a digital output signal based upon the position signal. The isolated-ADC further includes a means for generating the feedback signal based upon the position signal, where the digital output signal is electrically isolated from the analog input signal.

The present invention additionally relates to a method of providing a digital output signal based upon an analog input signal, where the digital output signal is electrically isolated from the analog input signal. The method includes receiving the analog input signal at a first actuator of a microelectromechanical system (MEMS), receiving a feedback signal at a second actuator of the MEMS, and generating movement of a beam element of the MEMS by way of the first and second actuators in response to the respective analog input and feedback signals. The method further includes sensing a position of the beam element of the MEMS at a sensor of the MEMS, comparing the sensed position with a reference value, generating a first digital signal in response to the comparing of the position and the reference value, where the first digital signal is at a high level while the sensed position is determined to be greater than the reference value and at a low level while the sensed position is determined to be less than the reference value, and generating, based upon the first digital signal, both the digital output signal and the feedback signal.

The present invention further relates to a method of providing a digital output signal based upon an analog input signal, where the digital output signal is electrically isolated from the analog input signal. The method includes receiving the analog input signal at a first actuator of a microelectromechanical system (MEMS), receiving a first feedback signal at a second actuator of the MEMS, and generating movement of a beam element of the MEMS by way of the first and second actuators in response to the respective analog input and first feedback signals. The method further includes sensing a position of the beam element of the MEMS at a sensor of the MEMS, comparing the sensed position with a reference value, and generating a first digital signal in response to the comparing of the position and the reference value, where the first digital signal is at a high level while the sensed position is determined to be greater than the reference value and at a low level while the sensed position is determined to be less than the reference value. The method additionally includes generating the digital output signal based upon the first digital signal, and differentiating the first digital signal to obtain an intermediate signal, where the first feedback signal is based upon at least one of the intermediate signal and the first digital signal.

The present invention additionally relates to a method of providing a digital output signal based upon an analog input signal, where the digital output signal is electrically isolated from the analog input signal. The method includes receiving the analog input signal at a first actuator of a microelectromechanical system (MEMS), receiving a feedback signal at a second actuator of the MEMS, and generating movement of a beam element of the MEMS by way of the first and second actuators in response to the respective analog input and feedback signals. The method further includes sensing a position of the beam element of the MEMS at a sensor of the MEMS, comparing the sensed position with a reference value and a plurality of offset values at a plurality of respective comparators, and generating a first digital signal in response to the comparing of the position and the reference value and a plurality of additional digital signals in response to the comparing of the position with the plurality of offset values, respectively. The method additionally includes generating the digital output signal based upon the first digital signal, processing at a logical decision device the first digital signal and the plurality of additional digital signals to obtain a feedback bitstream signal, and generating the feedback signal from the feedback bitstream signal by way of a digital-to-analog converter (DAC).

The present invention further relates to a method of providing a digital output signal based upon an analog input signal, where the digital output signal is electrically isolated from the analog input signal. The method includes receiving the analog input signal at a first actuator of a microelectromechanical system (MEMS), receiving a feedback signal at a second actuator of the MEMS, and generating movement of a beam element of the MEMS by way of the first and second actuators in response to the respective analog input and feedback signals. The method additionally includes sensing a position of the beam element of the MEMS at a sensor of the MEMS, providing an indication of the sensed position and a reference value to a differential amplifier, providing two intermediate signals from the differential amplifier to a comparator bias circuit, generating a digital signal at the comparator bias circuit based upon the high and low output signals, and generating, based upon the digital signal, both the digital output signal and the feedback signal.

The present invention additionally relates to a method of providing a digital output signal based upon an analog input signal, where the digital output signal is electrically isolated from the analog input signal. The method includes receiving the analog input signal at a first actuator of a microelectromechanical system (MEMS), receiving a feedback signal at a second actuator of the MEMS, generating movement of a beam element of the MEMS by way of the first and second actuators in response to the respective analog input and feedback signals, and damping the movement of the beam element of the MEMS by way of a damping element. The method further includes sensing a position of the beam element of the MEMS at a sensor of the MEMS, comparing the sensed position with a reference value, and generating a digital signal in response to the comparing of the position and the reference value, where the digital signal is at a high level while the sensed position is determined to be greater than the reference value and at a low level while the sensed position is determined to be less than the reference value. The method additionally includes determining the digital output signal based upon the digital signal and generating the feedback signal based upon the digital signal.

DETAILED DESCRIPTION OF THE INVENTION

Figure 1:
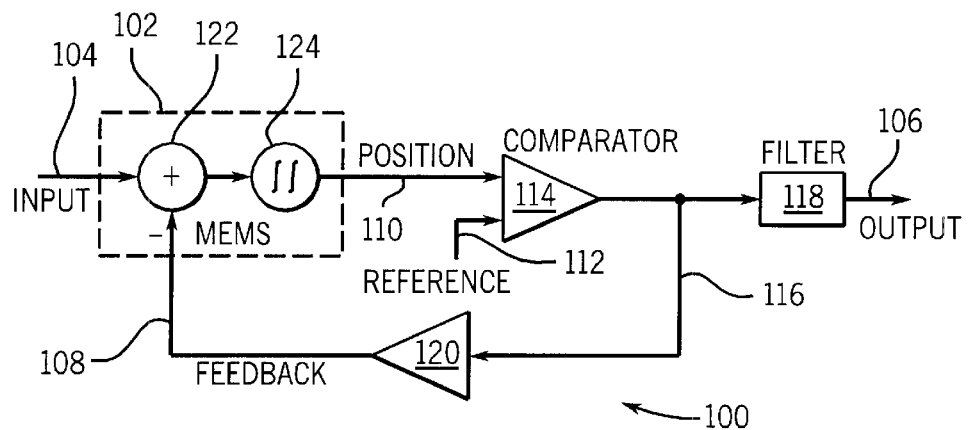
FIG. 1 is a schematic of a first embodiment of an isolated-ADC that employs a microelectromechanical system (MEMS)

Referring now to FIG. 1, a schematic of an exemplary isolated analog-to-digital converter (isolated-ADC) 100 implemented through the use of a microelectromechanical system (MEMS) 102 is shown. The isolated-ADC 100 receives an input signal 104 and, in turn, produces an output signal 106. The design of the isolated-ADC 100, and particularly the MEMS 102, allows for the output signal 106 to be electrically isolated from the input signal 104, as further discussed below. Although the output signal 106 is a digital signal, the output signal 106 can simply be converted into an analog signal by way of a digital-to-analog converter (DAC) (not shown). However, in the present embodiment, the output signal 106 is a digital signal that can be provided to and used by a computer, microprocessor to other digital device.

The isolated-ADC 100 operates by adding the force generated by the input signal 104 to the force generated by a feedback signal 108 within the MEMS 102. The MEMS 102 then effectively further integrates the sum of the two signals two times before outputting a position signal 110. The position signal 110 output from the MEMS 102 is then compared with a reference value 112 at a comparator 114, which in the preferred embodiment is a one-bit analog-to-digital converter (A/D). Based upon whether the position signal 110 is greater than or less than the reference value 112, the comparator 114 outputs a digital signal 116 that is a high value (e.g., 1) or a low value (e.g., 0), respectively. This digital signal 116 is then provided both to a filter 118, which in turn outputs the output signal 106, and also to a one-bit digital-to-analog converter 120 (DAC), which in turn generates the feedback signal 108. The filter 118 is typically a combination of a digital low-pass filter and a decimator, although in alternate embodiments the filter 118 can take on different forms. The MEMS 102 is shown in FIG. 1 to include separate summing and double-integration devices 122 and 124, respectively, in order to provide a schematic representation of the functional operations of the MEMS 102. However, the actual physical MEMS 102, as described more fully with respect to FIGS. 2–4, does not include such distinct devices.

Figure 2:
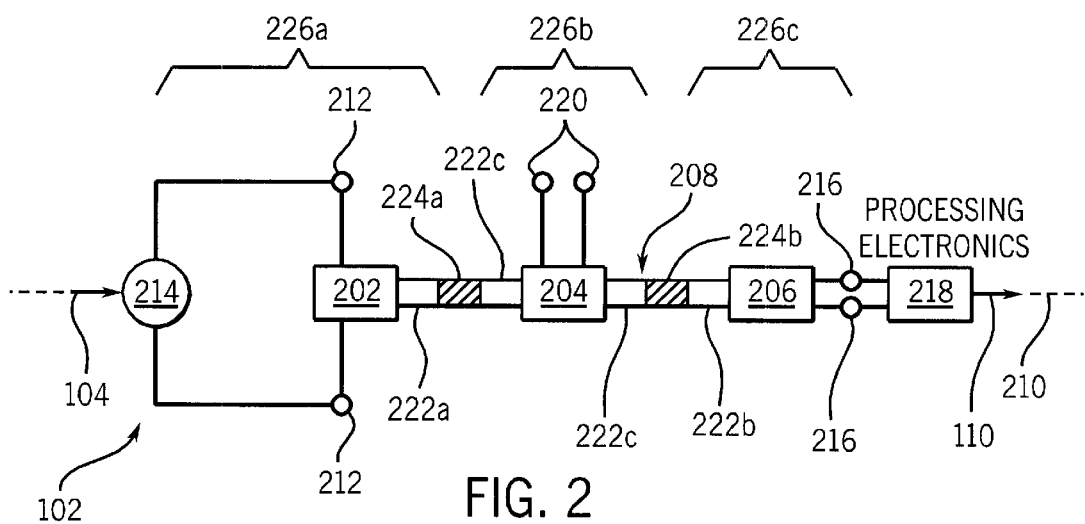
FIG. 2 is a block diagram of the MEMS of FIG. 1.

Turning to FIG. 2, a schematic view of the MEMS 102 shows the MEMS to include an input actuator 202, a control actuator 204, and a sensor 206 that are mechanically interconnected by a movable beam 208 that moves along a longitudinal axis 210. The input actuator 202 includes terminals 212 through which an analog electrical input signal 214 can be received and converted into a mechanical force tending to move the beam 208 along the axis 210. In the microscopic scale of the MEMS 102, the input actuator 202 can be a piezoelectric actuator, a thermal-expansion motor, a mechanical-displacement motor, an electrostatic motor, or a Lorentz-force motor generally known in the art, the latter two to be described in more detail below. For a Lorentz-force motor or thermal-expansion motor, the analog electrical input signal 214 will be a current, and for the piezoelectric or electrostatic motor, the input electrical signal will be a voltage. The analog electrical input signal 214 in some embodiments is the input signal 104 of FIG. 1, although in alternate embodiments the input signal 214 is functionally related or otherwise derived from the input signal 104.

The input actuator 202 communicates with a first end of the beam 208. An opposite end of the beam 208 is received by the sensor 206, which detects movement of the beam and provides an electrical signal indicative of the movement at one or more terminals 216. The electrical signal produced at the sensor terminals 216 can be output directly as, or further processed by processing electronics 218 to produce, the position signal 110 indicating the position (and movement) of the beam 208. The sensor 206 can be a piezoelectric-type sensor, a photoelectric sensor, a resistive sensor, an optical switching sensor, or a capacitive sensor according to techniques known in the art of MEMS design. In the preferred embodiment, the sensor 206 uses counterpoised movable plate capacitors as will be described in more detail below.

Attached to the beam 208 between the input actuator 202 and the sensor 206 is the control actuator 204, which in response to the feedback signal 108 of FIG. 1 provides a force on the beam 208 that counteracts the force provided by the input actuator 202 (although, in alternate embodiments, the control actuator 204 is capable of providing a force that supplements the force provided by the input actuator 202). The control actuator 204 includes terminals 220 at which the feedback signal 108 can be received and converted into a mechanical force tending to move the beam 208 along the axis 210. The force provided by the control actuator 204 can be adjusted by varying a current or voltage to the structure and, when operating in response to the feedback signal 108, tends to essentially eliminate all but a small movement of the beam 208. Some movement of the beam 208 is necessary for the sensor 206 to provide the position signal 110, but the movement can be reduced to an extent that non-linearities in the actuators and mechanical elements of the MEMS 102, which might occur with more pronounced movement, are eliminated.

The beam 208 includes conductive portions 222a and 222b, located at the input actuator 202 and sensor 206, respectively. Insulating portions 224a and 224b separate the conductive portions 222a and 222b from a centermost conductive portion 222c that can be part of the control actuator 204, such that the insulating portions 224a and 224b define three regions of isolation 226a–c. The first region 226a includes the input actuator 202 and conductive portion 222a, the second region 226b includes the center conductive portion 222c and the control actuator 204, and the third region 226c includes the conductive portion 222b and sensor 206. The insulated beam 208 provides a mechanism by which the analog electrical input signal 214 (or the input signal 104) acting through the actuator 202 can produce a corresponding output position signal 110 by way of the sensor 206 that is electrically isolated from the analog electrical input signal 214. The control actuator 204 can be electrically isolated from either the analog electrical input signal 214 and/or the position signal 110. It will be well appreciated by one skilled in the art that regions 226a, 226b, and 226c can be repositioned with respect to each other with no loss of function. For example, in one alternate embodiment, the sensor 206 is positioned in between the input actuator 202 and the control actuator 204.

Figure 3:
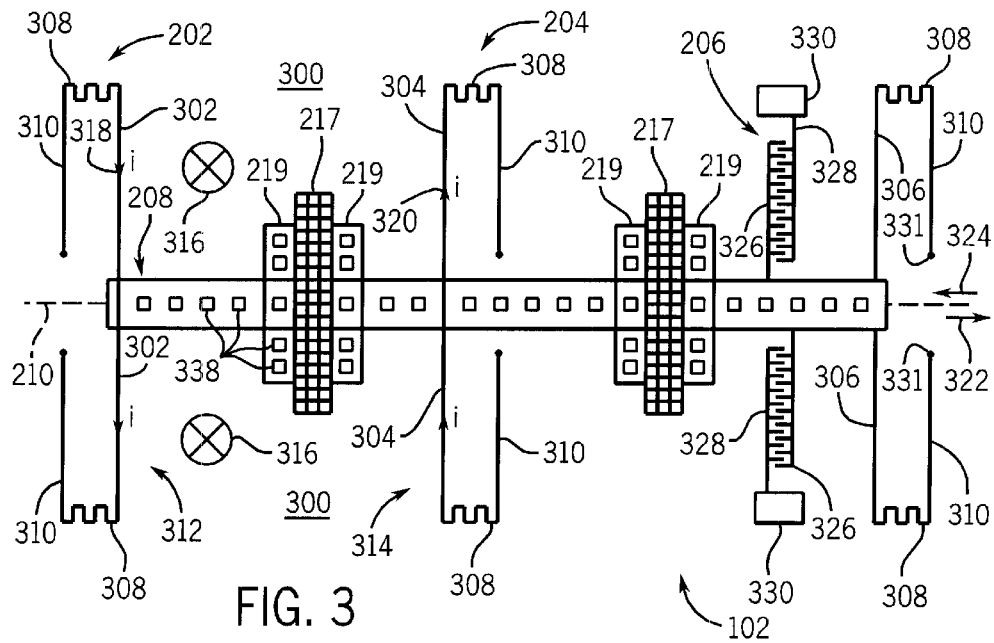
FIG. 3 is a simplified top plan view of one embodiment of the MEMS employed in the isolated-ADC of FIG. 1, where the MEMS employs Lorentz-force motors as actuators.

Referring now to FIG. 3, further detail is provided concerning the physical structure of an embodiment of the MEMS 102 in which Lorentz-force motors are employed in the input actuator 202 and the control actuator 204. Physically, the beam 208 extends along the axis 210 above a substrate 300, which ideally is an insulating substrate. The beam 208 is supported away from the substrate 300 and held for movement along the axis 210 by pairs of flexing arms 302, 304 and 306. As shown, the first pair of flexing arms 302 extend from the side of the beam 208 proximate the input actuator 202, the second pair of flexing arms 304 extend from roughly the middle of the beam, and the third pair of flexing arms 306 extend from the other side of the beam proximate the sensor 206. The flexing arms 302, 304, and 306 extend away from the beam 208 to respective elbows 308 that are transversely removed from the beam 208 on each side of the beam. The elbows 308 in turn connect to respective expansion compensators 310, which return to be attached to the substrate 300. Although in the present embodiment the expansion compensators provide stress relief, in alternate embodiments, the expansion compensators are not required. The flexing arms 302, 304 and 306 are generally parallel to the expansion compensators 310 to which the arms are connected.

Also as shown in FIG. 3, the beam 208 expands at two locations to create T-bars 219 flanking insulating portions 217. Insulating material that is attached to the T-bars 219 create the insulating portions 217. Generally the beam 208 can be fabricated using well-known MEMS processing techniques to produce a structure suspended above the substrate 300 and composed of a laminated upper conductive layer (for example polycrystalline silicon or crystalline silicon optionally with an upper aluminum layer) and a lower insulating layer such as silicon dioxide or silicon nitride. The insulating portions 217 can be obtained simply by etching away the upper layer according to techniques well known in the art using selective etching techniques. An improved method of fabricating these structures is described in U.S. Pat. No. 6,159,385 issued on Dec. 12, 2000, which is hereby incorporated by reference. The edges and comers of the T-bars 219 can be rounded to increase the breakdown voltage between them. Each of the upper conductive layer and lower insulating layer of the beam 208 is perforated by vertically extending channels 338 such as assists in conducting etchant beneath the upper and lower layers of the beam to remove a sacrificial layer that normally attaches those layers to the substrate 300 below according to techniques well known in the art.

Further referring to FIG. 3, the input actuator 202 and the control actuator 204 are first and second Lorentz-force motors 312 and 314, respectively. Each of the Lorentz-force motors 312, 314 operates by providing a current through a conductor that passes through a magnetic field such that the current-carrying conductor experiences a force. As shown, in the present embodiment, a magnetic field is generated (e.g., by way of a permanent magnet, not shown) adjacent to the MEMS 102 to produce a substrate-normal magnetic flux 316. The expansion compensators 310 supporting the flexing arms 302, 304 on opposite sides of the beam 208 are electrically isolated from each other so that voltages can be developed across each pair of the flexing arms between the corresponding elbows 308 on opposite sides of the beam 208 to allow currents 318, 320 to flow through the flexing arms 302, 304, respectively. The currents 318 and 320 that flow through the magnetic flux 316 produce longitudinal forces on the beam 208, causing the beam to move along the longitudinal axis 210.

The amount of movement produced by the respective Lorentz-force motors 312, 314 is generally determined by the density of the magnetic flux 316, the strengths of the respective currents 318, 320 and the flexibility (or spring constant) and length of the flexing arms 302, 304 and elbows 308, in accordance with the right hand rule. In the present embodiment, the first Lorentz-force motor 312 forming the input actuator 202 is designed to produce force that tends to urge the beam 208 in a first direction 322 (toward the sensor 206) along the axis 210, while the second Lorentz-force motor 314 forming the control actuator 204 is designed to produce force in the opposite direction 324. However, because the Lorentz-force motors 312, 314 are two quadrant devices and therefore can accept currents in either direction to produce forces that tend to cause the beam 208 to move in either direction along the axis 210, in alternate embodiments the MEMS 102 can operate with two polarities (unlike an optical isolator).

Referring still to FIG. 3, the MEMS 102 further includes the sensor 206, which is shown to include moving capacitor plates 326 and stationary capacitor plates 328. The stationary capacitor plates 328 are coupled to pads 330 that anchor the stationary capacitor plates to the substrate 300 and act as one of the terminals 216. The moving capacitor plates 326 are supported by the beam 208, electrically coupled to pads 331, and also interdigitated with the stationary capacitor plates 328. Variation in the capacitance between the moving capacitor plates 326 and stationary capacitor plates 328 is determined by sensing electronics known to those skilled in the art (not shown) connected to the stationary and moving capacitor plates by the pads 330, 331, and serves to indicate the position of the beam 208. As shown, the order of the moving and stationary capacitor plates 326 and 328 respectively is reversed on opposite sides of the beam 208. Thus, the moving capacitor plates 326 are to the left of the stationary capacitor plates 328 on a first side of the beam 208 (the upper side as depicted in FIG. 3), while the moving capacitor plates are to the right of the stationary capacitor plates on the other side of the beam.

Accordingly, as the beam 208 moves in the first direction 322, the capacitance formed by the upper moving capacitor plates 326 and stationary capacitor plates 328 increases while the capacitance formed by the lower plates decreases. The point where the value of the upper capacitance crosses the value of the lower capacitance precisely defines a null point and is preferably set midway in the travel of the beam 208. This point can be considered to mark the position of the beam 208 corresponding to the reference value 112 of FIG. 1. Techniques for comparing capacitance well known in the art can be used to evaluate the position of the beam 208. One circuit for providing extremely accurate measurements of these capacitances is described in co-pending U.S. patent application Ser. No. 09/677,037 filed Sep. 29, 2000, which is hereby incorporated by reference.

The operation of the MEMS 102 of FIG. 3 is properly represented by the summing device 122 and the double-integration device 124 of FIG. 1 as follows. The input signal 104 is converted into a first force applied to the beam 208 by the input actuator 202. The feedback signal 108 is the signal provided to the control actuator 204, which results in a second force being applied to the beam 208. Because the two forces are applied to the same beam 208, the two forces are physically summed by the operation of the beam 208. Because the currents 318 and 320 flow in opposite directions such that the input actuator 202 applies force in a direction opposite to that applied by the control actuator 204, it is proper to represent the physical operation of the beam 208 as a summing device which subtracts the feedback signal 108 from the input signal 104. As the beam 208 moves in response to the forces applied by the input actuator 202 and the control actuator 204, the sensor 206 (and additional processing electronics 218 as shown in FIG. 2) then provides the position signal 110 indicative of the position of the beam 208. Because the acceleration of the beam 208 is directly related to the force applied to it (e.g., by the mass of the beam 208 and moving capacitor plates 326), and because position is the double integral of acceleration, the position signal 110 is equivalent to the double integral of the input signal 104 less the feedback signal 108.

It will be understood with greater circuit complexity that certain of the elements of the input actuator 202, control actuator 204 and sensor 206 can be combined into individual structures. Hence, these terms should be considered to cover the functional equivalents of the input actuator 202, control actuator 204 and sensor 206 whether or not they are realized as individual structures or not. Further, the relative locations of the input actuator 202, the control actuator 204 and the sensor 206 can be swapped and still provide isolated signal transmission.

Figure 4:
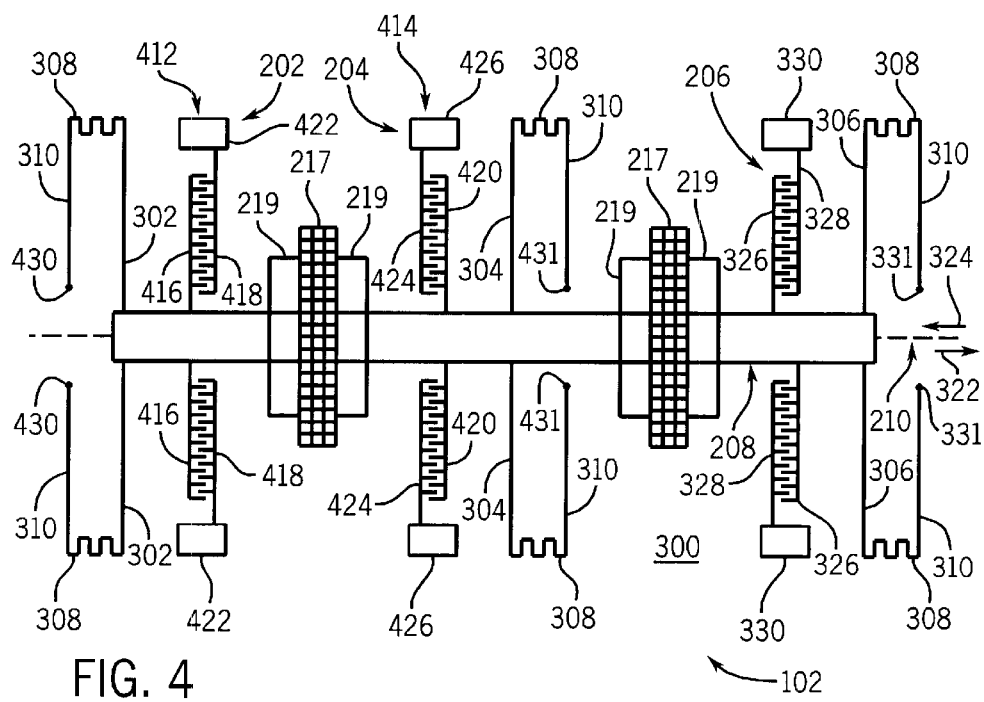
FIG. 4 is a top plan view of an alternate embodiment of the MEMS employed in the isolated-ADC of FIG. 1, where the MEMS employs electrostatic motors as actuators.

Referring now to FIG. 4, further detail is provided concerning an alternate embodiment of the MEMS 102 in which electrostatic motors 412, 414 are employed for the input actuator 202 and the control actuator 204 instead of the Lorentz-force motors 312, 314 of FIG. 3. As with respect to FIG. 3, the MEMS 102 still includes three pairs of flexing arms 302, 304, and 306, as well as the expansion compensators 310 and the elbows 308 coupling the flexing arms to the expansion compensators. Also, the MEMS 102 includes the beam 208 having two insulating portions 217 and T-bars 219 between the insulating portions and the remaining portions of the beam. Further, the MEMS 102 still includes the sensor 206, which includes the moving capacitor plates 326, and the stationary capacitor plates 328. As with FIG. 3, the moving and stationary capacitor plates 326, 328 are respectively coupled electrically to pads 331, 330 to allow for measurement of the capacitance between the plates.

In contrast to the embodiment of FIG. 3, however, the MEMS 102 of FIG. 4 does not require the generation of the magnetic flux 316, nor does it require any currents to flow through the flexing arms 302 and 304 in order to develop force to move the beam 208. Instead, the MEMS 102 includes the additional electrostatic motors 412, 414. The first and second electrostatic motors 412, 414 each include a set of moving capacitor plates 416, 420 and a set of stationary capacitor plates 418, 424, respectively. As shown, the moving capacitor plates 416, 420 and stationary capacitor plates 418, 424 for each of the electrostatic motors 412, 414, respectively, are interdigitated with one another. The sets of stationary capacitor plates 418, 424 are attached to and electrically coupled to pads or pylons 422, 426, respectively, while the sets of moving capacitor plates 416, 420 are electrically coupled to pads 430, 431. The pads 422, 430 correspond to the terminals 212 of FIG. 2, while the pads 426, 431 correspond to the terminals 220 of FIG. 2.

Each of the moving capacitor plates 416, 420 and their corresponding stationary capacitor plates 418, 424 can have mutually engaging fingers (as opposed to being simple parallel plate capacitors) so as to provide for a more uniform electrostatic force over a greater range of longitudinal travel of the beam 208. The thus formed electrostatic motors 412, 414 operate using the attraction between the capacitor plates 416, 420, 418, and 424. Specifically, when the voltage differential applied between the pads 430 and 422 is greater than that applied between pads 431 and 426, the beam 208 moves in the first direction 322, and when the voltage differential applied between the pads 431 and 426 is greater than that applied between the pads 430 and 422, the beam 208 moves in the second direction 324. In contrast to the capacitor plates of the sensor 206, the moving capacitor plates 416, 420 and the stationary capacitor plates 418, 424 are positioned the same on either side of the beam 208. Thus, the effects of the capacitor plates 416, 418 of the input actuator 202 on either side of the beam 208 are additive to one another, as are the effects of the capacitor plates 420, 424 of the control actuator 204 on either side of the beam 208.

All of the capacitor plates 326, 328, 416, 418, 420 and 424 are cantilevered over the substrate 300 by the same under-etching used to free the beam 208 from the substrate 300. Generally, the operating structure of the MEMS 102 is constructed to be symmetric about an axis through the middle of the beam 208 along the longitudinal axis 210 such as to better compensate for any thermal expansions or contractions. In addition, the operating area of the capacitor plates 416, 418, 420 and 424 on both sides of the beam 208 for the input actuator 202 and the control actuator 204 are made equal so as to be balanced.

Figure 5:
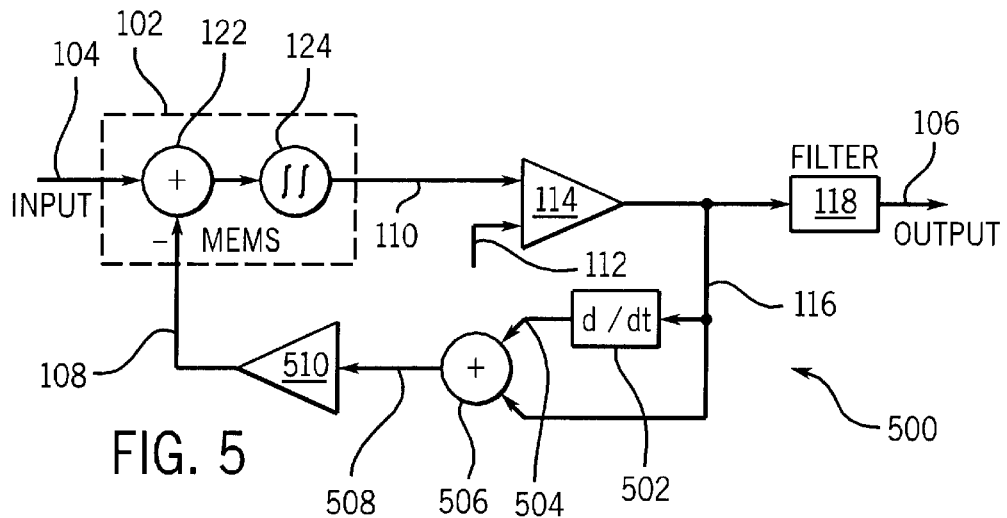
FIG. 5 is a schematic of a second embodiment of an isolated-ADC that employs a MEMS and also includes a differentiator.

Turning now to FIG. 5, a schematic of a second embodiment of an isolated-ADC 500 implemented through the use of the microelectromechanical system (MEMS) 102 is shown. In this embodiment, the MEMS 102 again receives the input signal 104, sums the input signal 104 with a feedback signal 108, and doubly integrates the resulting sum to obtain the position signal 110. The position signal 110 again is compared against the reference value 112 to produce the digital signal 116, which in turn is used to generate the output signal 106. However, in contrast to the isolated-ADC 100, the isolated-ADC 500 does not generate the feedback signal 108 immediately from the digital signal 116 by way of the DAC 120. Rather, the isolated-ADC 500 first operates to obtain, by way of a differentiator 502, an intermediate signal 504 that is the first derivative of the digital signal 116 with respect to time (or proportionally related to the first derivative by a factor). The intermediate signal 504 is then added to the digital signal 116 (or a signal proportionally related to the digital signal by another factor) by way of an additional summing device 506, and the resulting sum signal 508 is then converted by way of a two-bit DAC 510 into the feedback signal 108. In an alternate embodiment, two 1-bit DACs could be used to convert the signals 504 and 116, respectively, and then the resulting signals could be added at a different summation device or even by way of the MEMS 102 (figuratively by way of the summation device 122).

The isolated-ADC 500 is an improvement over the first isolated-ADC 100 insofar as it has greater stability. This stability is a characteristic of the second isolated-ADC 500 because the feedback signal 108 generated by the isolated-ADC 500 includes a component related to the first integral of the acceleration experienced by the MEMS 102 beam 208 (that is, the velocity of the beam). However, the isolated-ADC 500 is also more complex than the first isolated-ADC 100 insofar as the DAC 510 is a two-bit DAC rather than a one-bit DAC. The two-bit DAC 510 is necessary because, while the digital signal 116 can take on values of zero or one (e.g., high or low values), the intermediate signal 504 can take on values of zero, one and negative one depending upon how the digital signal 116 has most recently behaved. Thus, the sum signal 508 can take on values of two, one, zero, and minus one and consequently the DAC 510 must be a two-bit DAC.

Figure 6:
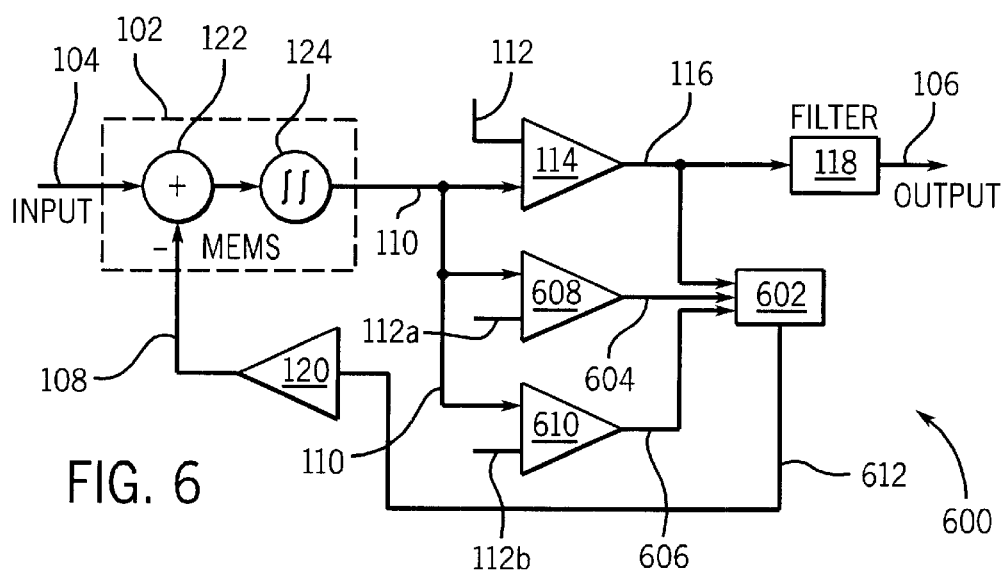
FIG. 6 is a schematic of a third embodiment of an isolated-ADC that employs a MEMS and three comparators.

Referring next to FIG. 6, the MEMS 102 can also be employed in a third embodiment of an isolated-ADC 600. As shown, the MEMS 102 in this embodiment continues to receive both the input signal 104 and the feedback signal 108, which is provided from the one-bit DAC 120. The MEMS 102 again adds these two signals 104, 108 and doubly-integrates the resulting sum in order to generate the position signal 110. In contrast to the isolated-ADC 500, however, the isolated ADC 600 does not employ a differentiator in order to obtain the derivative of the digital signal 116 that can be added to the digital signal in order to stabilize operation of the isolated-ADC 600. Rather, the isolated-ADC 600 generates in addition to the first digital signal 116, a second digital signal 604 and a third digital signal 606. These additional second and third digital signals 604, 606, in conjunction with the first digital signal 116, are used to logically determine a feedback bitstream signal 612 by way of a logical decision device 602, which in one embodiment can be a programmable logic device, such as a field programmable gate array (FPGA), or an application specific integrated circuit (ASIC). The second and third digital signals 604, 606 are respectively generated from the position signal 110, by way of a second comparator 608 and a third comparator 610, at which the position signal is compared against first and second offset values 112a and 112b, respectively.

Figure 8:
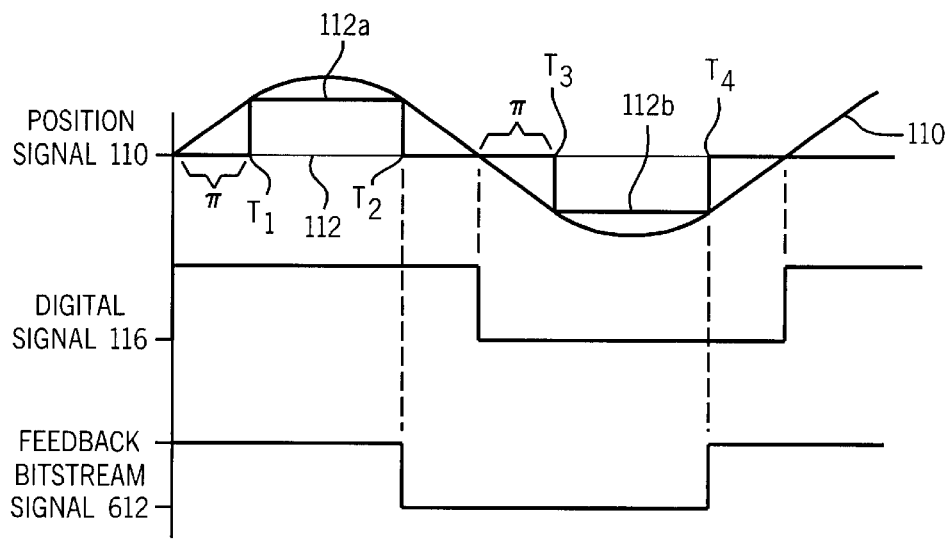
FIG. 8 is a graph showing exemplary time variation of the position signal output by the MEMS of FIG. 6 relative to a reference value, and corresponding time variation of the outputs of one of the comparators and a logical decision device coupled to the MEMS.

Referring to FIG. 8, the second and third digital signals 604, 606 are generated from the position signal 110 as follows. As shown, the position signal 110 output from the MEMS 102 typically is quasi-sinusoidal (or at least periodic) and oscillates about the reference value 112 (with a feedback signal applied). The second comparator 608 generates the second digital signal 604 from the first offset value 112a and the position signal 110. The first offset value 112a is obtained (sampled and held) from the position signal 110 at a time T1 that is a minimum of one clock cycle ($\pi$) after the position signal 110 has gone from below the reference value 112 to above the reference value. The second comparator 608 then monitors the position signal 110 until a time T2 when the position signal returns to the held first offset value 112a. While up until time T2, the second comparator 608 outputs a one value as the second digital signal 604, at time T2 the second comparator 608 then outputs a zero value, typically one clock cycle before the position signal 110 goes from above the reference value 112 to below the reference value.

Similarly, the third comparator 610 generates the third digital signal from the second offset value 112b and the position signal 110. The second offset value 112b is obtained (sampled and held) from the position signal 110 at a time T3 that is a minimum of one clock cycle ($\pi$) after the position signal 110 has gone from above the reference value 112 to below the reference value. The third comparator 610 then monitors the position signal 110 until a time T4 when the position signal returns to the held second offset value 112b. While up until time T4, the third comparator 610 outputs a zero value as the third digital signal 606, at time T4 the third comparator 610 then outputs a one value, typically one clock cycle before the position signal 110 goes from below the reference value 112 to above the reference value.

The effect of the second and third comparators 608, 610 is similar to that of the differentiator 502 insofar as the time-average value of the feedback bitstream signal 612 that is produced by the logical decision device 602 that uses the first, second, and third digital signals 116, 604 and 606 is approximately the same as the sum signal 508 produced by the summing device 506. That is, although the output of the logical decision device 602 does not rise above a value of one or fall below a value of zero, the time average value of the feedback bitstream signal 612 is approximately the same as that of the sum signal 508. More specifically, while the second and third comparators 608, 610 do not cause the feedback bitstream signal 612 to fall below zero, the second comparator 608 does cause the feedback bitstream signal 612 to fall to zero approximately one clock cycle prior to the time at which the output digital signal 116 becomes zero due to the changing value of the position signal 110. Likewise, while the second and third comparators 608, 610 do not cause the feedback bitstream signal 612 to rise above a value of one, the third comparator 610 does cause the feedback bitstream signal to attain a value of one approximately one clock cycle prior to the time at which the output digital signal 116 becomes a one due to the changing value of the position signal 110. Thus, by anticipating the times at which the position signal 110 changes from being below or above the reference value 112 and adding or subtracting pulses in anticipation of these occurrences, the second and third comparators 608, 610 cause the time-average value of the sum signal 612 to approximate the time-average value of the sum signal 508.

Figure 9:
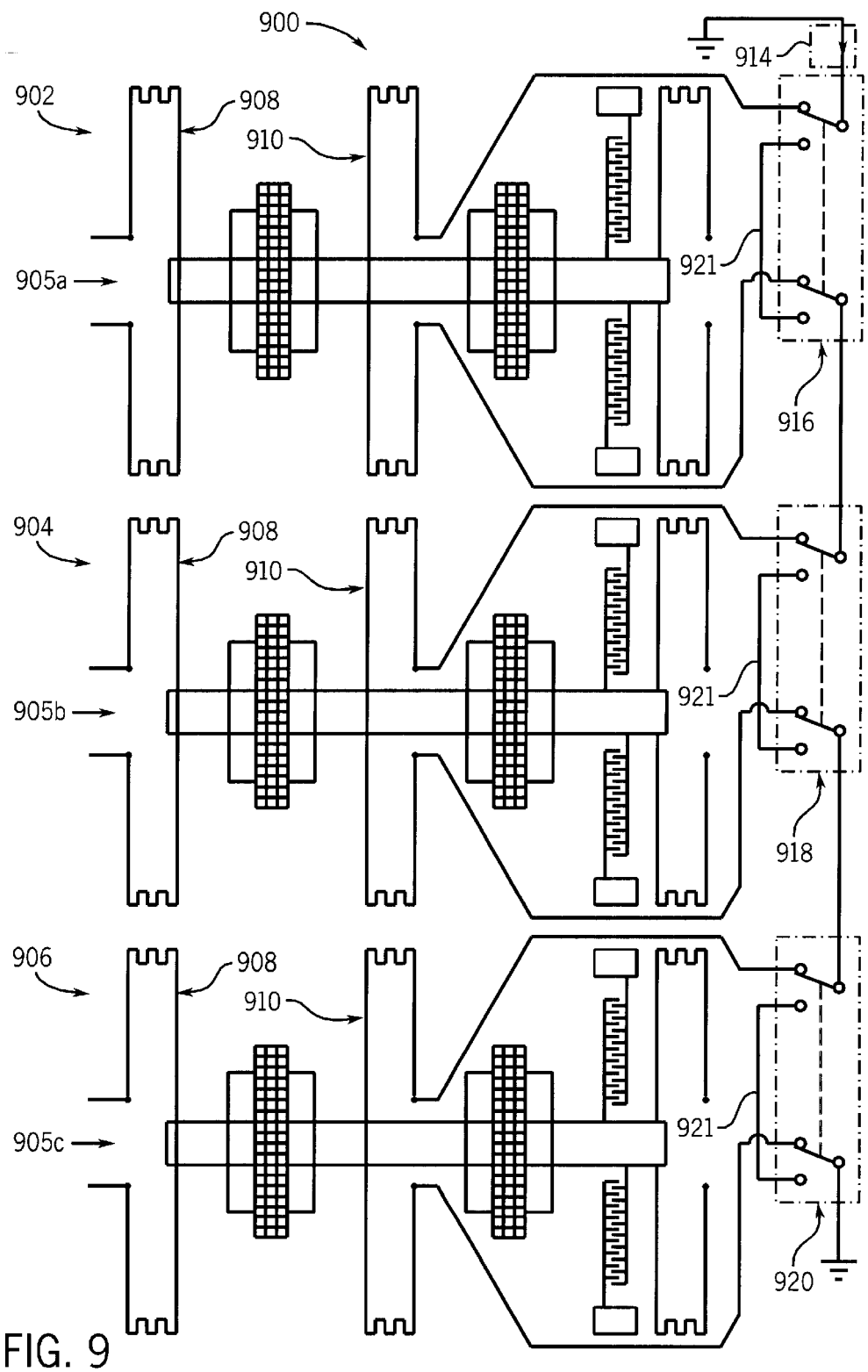
FIG. 9 is a top plan view of multiple MEMS devices situated side-by-side, which can be employed in multiple isolated-ADCs.

Both of the second and third comparators 608, 610 provide effectively the same advantage to the isolated-ADC 600 as the differentiator 502 provides to the isolated-ADC 500, namely, the devices add to the stability of the isolated-ADCs. Although the isolated-ADC 600 has two comparators 608, 610 in place of the single differentiator 502 of the isolated-ADC 500, the structure of the isolated-ADC 600 is advantageous relative to the isolated-ADC 500 in that multiple isolated-ADCs can more easily be implemented on a single device as shown in FIG. 9. Because the isolated-ADC 600 employs the one-bit DAC 120 rather than the two-bit DAC 510, the control-elements of multiple isolated-ADCs can be supplied with power from a single current (or voltage) source that is simply switched on and off by the DAC. In contrast, in order to implement the two-bit DAC 510, a more complicated switching mechanism is required. In alternate embodiments, isolated-ADCs similar to the isolated-ADC 600 can be designed with more than three comparators and more than two offset levels. In such embodiments, the reference value 112 is again provided to the first comparator, each of the offset levels is provided to an additional respective one of the comparators, and the output signals from the comparators are again provided to a logical decision device. The use of more than two comparators makes it possible to compare the position signal 110 with respect to more than one offset level above and/or below the reference value 112. Consequently, the logical decision device 602 can determine additional information regarding the position signal 110 including, for example, the slope or rate of change of the position signal.

Figure 7:
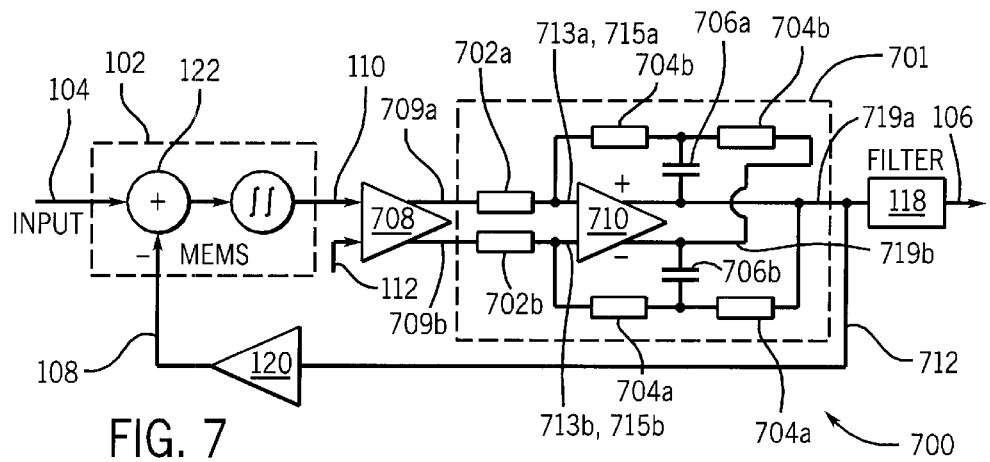
FIG. 7 is a schematic of a fourth embodiment of an isolated-ADC that employs a MEMS and a comparator bias circuit.

Referring next to FIG. 7, the MEMS 102 can also be employed in a fourth embodiment of an isolated-ADC 700. As shown, the MEMS 102 in this embodiment continues to receive both the input signal 104 and the feedback signal 108, which is provided from the one-bit DAC 120. The MEMS 102 again adds these two signals 104, 108 and doubly-integrates the resulting sum in order to generate the position signal 110. In contrast to the isolated-ADC 600, however, the isolated-ADC 700 does not employ the second and third comparators 608, 610 and logical decision device 602 in order to logically generate the feedback bitstream signal 612 in order to stabilize operation of the isolated-ADC. Rather, in this embodiment the isolated-ADC 700 employs a differential amplifier 708 and a comparator bias circuit 701 to generate a digital signal 712, which is provided to the one-bit DAC 120 for generation of the feedback signal 108. As discussed further below, the comparator bias circuit 701 internally includes a feedback mechanism that has a similar effect of stabilizing the operation of the isolated-ADC as is provided by the second and third comparators 608, 610 and logical decision device 602 in the isolated-ADC 600.

Specifically, the differential amplifier (or transconductance amplifier) 708 receives the position signal 110 from the MEMS 102 and the reference value 112 and periodically samples those values (e.g., at every 1 microsecond). Plus and minus output signals 709a, b of the differential amplifier 708 are then provided to the comparator bias circuit 701. Depending upon whether the position signal 110 is above or below the reference value 112, the plus output signal 709a will be above the minus output signal 709b, or vice-versa. The plus and minus output signals 709a, b in particular are provided to respective resistors 702a, b within the comparator bias circuit 701, which in turn are coupled to respective input terminals 713a, b of a comparator 710 within the comparator bias circuit. The comparator 710 periodically compares the voltage signals 715a, b (e.g., at every 1 microsecond) provided at the respective input terminals 713a, b, and in response produces high and low output signals 719a, b in dependence upon the relative voltage levels of the two voltage signals 715a, b. Each of the high and low output signals 719a, b can take on high or low values (e.g., 0 or 5 volts). The voltage signals 715a, b are based upon the plus and minus output signals 709a, b provided to the resistors 702a, b, respectively, and also upon the low and high output signals 719b, a, respectively. That is, the high output signal 719a is fed back to the input terminal 713b, and the low output signal 719b is fed back to the input terminal 713a.

The high and low output signals 719a, b are fed back to the input terminals 713b, a by way of networks of resistors and capacitors in such a way as to offset the voltage signals 719b, a from the values that the voltage signals would otherwise attain due to the plus and minus output signals 709a, b. Specifically, the high output signal 719a is fed back via a pair of resistors 704a to the input terminal 713b of the comparator 710, while the low output signal 719b is fed back via a pair of resistors 704b to the other input terminal 713a. The high output signal 719a additionally is coupled to the junction between the two resistors 704b by a first capacitor 706a, while the low output signal 719b is coupled to the junction between the two resistors 704a by a second capacitor 706b. The two sets of resistors 704b, 702a and 704a, 702b each act as 20:1 resistor divider networks, such that the influence of the high and low output signals 719a, b upon the voltage signals 719b, a is approximately a +/−5% voltage shift (relative to the values the voltage signals would otherwise attain due to the plus and minus output signals 709a, b). These voltage shifts effectively constitute the introduction of fixed bias offsets with respect to the reference signal. The capacitors 706a, b delay the effects of the high and low output signals 719b, a upon the voltage signals 715a, b, respectively, so that toggling of the values of the high and low output signals 719a, b (e.g., from 0 to 5 volts or vice-versa) does not immediately impact the voltage signals 715b, a. These time delays allow the position signal 110 adequate time to move beyond the established fixed bias offsets for each occurrence at which the position signal 110 has gone above or below the reference signal 112 (e.g., the values of the position signal 110 at times T1 and T3 shown in FIG. 8). The two fixed bias offsets only affect operation of the comparator 710 when the position signal 110 is returning to the reference signal 112 (e.g., the values of the position signal 110 at times T2 and T4 shown in FIG. 8). It is at these times that the output signals 719a, b of the comparator 710 will toggle earlier than would otherwise be the case, such that an advanced feedback is provided to the MEMS 102.

The isolated-ADC 700 with the comparator bias circuit 701 is built on the same concept as the third embodiment of the isolated-ADC 600 (shown in FIG. 6). The advantage of the isolated-ADC 700 over the isolated-ADC 600 is that only one comparator is used. While both embodiments attempt to offset the position signal 110 with a bias value, the bias values of the third embodiment are dynamic, based on the sample and hold method and updated every time the position signal 110 goes above or below the reference value 112. In contrast, the comparator bias circuit 701 uses a fixed bias offset, based upon the resistor divider networks formed by the resistors 702, 704*a, b*, and toggles between two fixed bias offset values every time the position signal 110 goes above or below the reference value 112. The effect of the comparator bias circuit 701 is similar to that of the second and third comparators 608, 610 and the logical decision device 602 insofar as the time-average value of the digital signal 712 that is produced by the comparator bias circuit 701 is approximately the same as the feedback bitstream signal 612 produced by the logical decision device 602.

In contrast to the isolated-ADCs 100, 500 and 600, which show only comparators 114, 608 and 610, the isolated-ADC 700 of FIG. 7 shows both a separate differential amplifier 708, which acts as a pre-amplifier, and a comparator 710. Nevertheless, it should be understood that the comparators 114, 608 and 610 of the isolated-ADCs 100, 500 and 600 also can (and typically do) perform both amplification and comparison functions. In an alternate embodiment, the capacitors 706*a, b* are returned to ground rather than coupled to the output signals 719*a, b* of the comparator 710. In such an embodiment, the junction between the two resistors 704*b* is coupled to ground by the first capacitor 706*a*, while the junction between the two resistors 704*a* is coupled to ground by the second capacitor 706*b*. Further, while in the present embodiment the resistors 702*a, b* and 704*a, b* are chosen to operate as 20:1 resistor divider networks such that offsets of the voltage signals 719*b, a* caused by the feeding back of the output signals 719*a, b* are approximately +/-5% of the values of the voltage signals, in alternate embodiments other resistor values can be employed to provide resistor divider networks that increase or decrease the overall offsets caused by feeding back the output signals 719*a, b*. The overall amounts of allowed feedback should be chosen to correspond to the particular characteristics of the MEMS 102, particularly the spring constant, mass and damping of the MEMS. This is in contrast to the comparators 608, 610 of the isolated-ADC 600, which need not be adjusted in their operation depending upon which MEMS is being used. Additionally, while the value selected for capacitors 706*a, b* in the present embodiment is based upon an RC discharge of approximately 1.5 times the sample period, in alternate embodiments the value can vary.

Referring to FIG. 9, a set of three MEMS devices 902, 904 and 906 are shown to be implemented together on a single chip 900. Although three MEMS devices are shown, in alternate embodiments a different number of devices (e.g., eight devices) can be implemented on the chip. The three MEMS devices employ Lorentz-force motors as input actuators 908 and additional Lorentz-force motors as control actuators 910. Because Lorentz-force motors are employed, a single current source can be used to supply necessary actuating power to the multiple control actuators 910. By using a single current source for operating multiple control actuators, the integrated circuit can be made more energy efficient (e.g., due to less heat dissipation).

As discussed above with reference to FIG. 6, for example, the feedback signal 108 provided to the MEMS 102 is a pulsed signal controlled by the one-bit DAC switch 120. Where three isolated-ADCs 600 are operated using the MEMS devices 902, 904 and 906 on the chip 900, the switching currents provided to the Lorentz-force motors of the three different control actuators 910 should vary due to the different input signals 905*a–c* to which each input actuator 908 is subjected. In order to provide such variable switching of currents to the different control actuators, first, second and third switching devices 916, 918 and 920 are employed. As shown, the first switching device 916 can be switched between a first state in which current is directed to the control actuator of the MEMS 902, and a second state in which the current is directed to the bypass element 921. By varying the duty cycle of the first switching device 916, therefore, the time-average value of current that is directed toward the control actuator 910 of the MEMS 902 can be varied.

The second switching device 918 in turn works in the same manner as the first switching device 916 only in response to commands from another DAC switch 120. The second switching element 918 determines the time-average value of the current that is directed toward the control actuator 910 of the MEMS 904, again by varying the duty cycle of the current directed to the control actuator 910 and directing the remaining current to the respective bypass element 921. Thus, the control actuator of the MEMS 904 can obtain a different time-average value of current than the control actuator of the MEMS 902. Similarly, the third switching device 920 determines the amount of current that is directed to the control actuator 910 of the MEMS 906. Upon passing through the control actuator of MEMS 906 (the third and final MEMS of the set) or the third bypass element 921, the current is directed to ground from which it can return to the current source 914.

In alternate embodiments, a variety of other configurations are possible in which multiple MEMS devices are incorporated on a single chip. For example, in one alternate embodiment, only the input actuators 908 employ Lorentz-force motors, while the control actuators 910 employ another type of motor, such as an electrostatic motor (or vice-versa). In other embodiments, where electrostatic motors are used, a single voltage source can be used to apply the same voltage to multiple control actuators coupled in parallel, where switching devices are employed to determine the time-average voltages applied to each control actuator.

Figure 10:
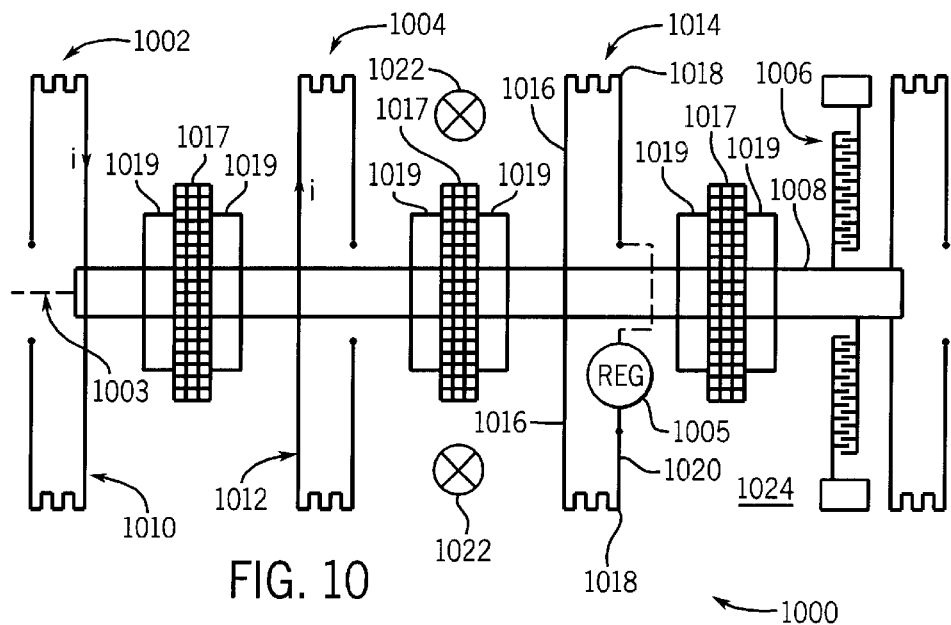
FIG. 10 is a top plan view of an additional embodiment of a MEMS that employs a damping element.

Referring to FIG. 10, another embodiment of a MEMS 1000 includes an input actuator 1002, a control actuator 1004 and a sensor 1006 that interact with a physical beam 1008. As with respect to FIG. 3, the input actuator 1002 and control actuator 1004 are shown to employ respective Lorentz-force motors 1010 and 1012 although, in alternate embodiments, other types of motors such as electrostatic motors could instead be employed as discussed above. A significant difference between the MEMS 1000 and the MEMS 102 of FIGS. 2–4 is that the MEMS 1000 includes an additional damping element 1014. The damping element 1014 includes a pair of flexing arms 1016, elbows 1018 and a stationary conductor portion 1020 that remains stationary despite movement of the beam 1008 and the flexing arms 1016. Thus, the damping element is essentially a wire loop in which the enclosed area expands or contracts as the beam 1008 moves along an axis 1003. More particularly, the damping element 1014 is configured so that at rest, the stationary conductor portions 1020 are directly above the flexing arms 1016 (the moving portions of the damping element) with respect to the wafer 1024. As the beam 1008 moves in response to the force generated by actuators 1002 or 1004, the flexing arms 1016 move and effectively open an aperture.

Given the application of a magnetic flux 1022 normal to the substrate 1024 above which the MEMS 1000 is positioned, the force that is produced in the damping element 1014 varies with movement of the beam 1008. In accordance with Lenz's law, an emf (electromotive force) is induced. A control device 1005 is connected to the damping element 1014 to control flow resulting from the induced EMF whenever the beam 1008 moves. The direction of this induced current in the flexing arm 1016 is such that the Lorentz force produced by its interaction with the external magnetic field is so as to oppose the motion of beam 1008. In addition, the magnitude of the induced current, and therefore the induced force, is proportional to the rate of change of the area of the loop 1014 and to the current allowed to flow by the control device 1005. This induced force, therefore acts to dampen the movement of the beam 1008. Given the addition of the damping element 1014 in the MEMS 1000 relative to MEMS 102 as shown in FIG. 3, the MEMS 1000 includes three sets of T-bars 1019 and insulating portions 1017 in between the input actuator 1002, the control actuator 1004, the damping element 1014 and the sensor 1006, rather than merely two sets of T-bars 219 and insulating portions 217.

Figure 11:
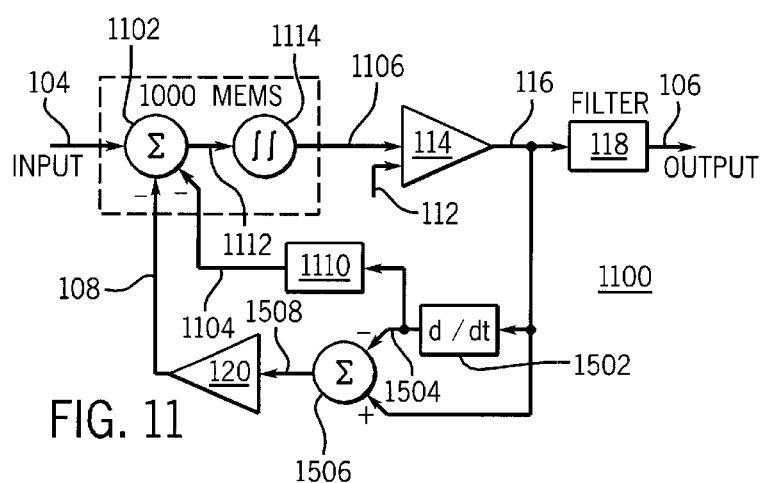
FIG. 11 is a schematic of a fifth embodiment of an isolated-ADC that employs the MEMS of FIG. 10.

Referring to FIG. 11, a schematic of a fifth embodiment of an isolated-ADC 1100 that operates by way of the MEMS 1000 of FIG. 10 shows that the MEMS receives the input signal 104 and adds, by way of a summing device 1102, the input signal to both the feedback signal 108 from the DAC 120 and a damping signal 1104. The summing device 1102 is a schematic representation of the physical addition by the beam 1008 of the forces applied to it by the input actuator 1002, the control actuator 1004 and the damping element 1014. As with the earlier embodiment of the isolated-ADC 500 described above with reference to FIG. 5, the sensor 1006 of the MEMS 1000 produces a position signal 1106 that is in turn provided to the comparator 114 that compares the position signal 1106 with the reference value 112 and in response outputs the digital signal 116. The digital signal 116, in addition to being provided to the filter 118 to generate the output signal 106, is also provided to a differentiator 1502 and a summing device. The differentiator 1502 produces a differentiated signal 1504 that is converted into the damping signal 1104 by a processing device 1110, and is also provided to the summing device 1506, which adds the differentiated signal 1504 to the digital signal 116 to produce a digital feedback signal 1508 for the DAC 120. Thus, in contrast to the isolated-ADC 500, the isolated-ADC 1100 has damping capability (as is proportional to velocity). In practice, the damping element 1014, similar to that shown in FIG. 10, can be a Lorentz-force motor and the processing device 1110 can be simply a shorting resistance (providing damping through a generated countervailing magnetic field) or can be other well-known circuitry. In alternate embodiments, more than one damping element such as the damping element 1014 can be employed in the isolated-ADC 1100 of FIG. 11. Also, in further alternate embodiments, one or more damping elements such as the damping element 1014 can be similarly added to and utilized in the other embodiments of isolated-ADCs described above.

Although in the above FIGS. 1–7 and 9–11, the MEMS devices 102, 902, 904, 906 and 1000 are shown to include only the input actuators, control actuators, sensors and (with respect to the MEMS 1000) damping elements necessary for producing position signals in response to the input signals 104 and the feedback signals 108, in alternate embodiments the MEMS devices can include on a single integrated circuit not only these elements but also one or more of the additional elements of the isolated-ADCs. MEMS fabrication allows for the building of integrated circuits having a number of solid-state devices such as, for example, the comparators 114, 608, 610, and 710, the DACs 120, and 510, the summing devices 506, 1506, and the filter 118 discussed above, as well as a variety of other devices. Additionally, as shown in FIG. 9, multiple MEMS devices with or without such additional solid-state devices can be provided on a single integrated circuit. Thus, multiple MEMS-based isolated-ADCs can be placed on a single integrated circuit with appropriate interconnects made for providing them with the currents required. In another embodiment, all MEMS components would be on a single chip, and all other electronic components would be on a single ASIC chip. In such an embodiment, many different channels could then be implemented on a total of two chips. Further embodiments with multiple chips and/or multiple discrete devices are also possible.

Further, insofar as the MEMS-based isolated-ADCs are employed as isolated-ADCs, it will be understood that the parameter that is provided to the analog isolated-ADC as the input signal need not be an electrical parameter but can be any physical parameter that can be converted to movements of a beam (e.g., the beam 208) on a microscopic level. Thus for example, the parameter can be pressure with the actuator (e.g., the actuator 202) directly connected to a flexible diaphragm or the like. Further the beams (e.g., the beam 208) need not be set for linear motion but in fact can rotate about an axis. Further, although the actuators and sensor shown above include single actuator or sensor elements, in alternate embodiments the actuators or sensors can include two or more (multiple) actuator or sensor elements, respectively. For example, the input actuator 202 of FIG. 3 in alternate embodiments could include two sets of Lorentz-force motor actuator elements, e.g., two pairs of flexing arms 302, elbows 308 and expansion compensators 310.

It is specifically intended that the present invention not be limited to the embodiments and illustrations contained herein, but that modified forms of those embodiments including portions of the embodiments and combinations of elements of different embodiments also be included as come within the scope of the following claims.

We claim:

1. An isolated-ADC providing isolation between an analog input signal and a digital output signal, the isolated-ADC comprising:

a microelectromechanical system (MEMS) including:
 a substrate;
 a beam element supported from the substrate for movement with respect to an axis relative to the substrate;
 a first actuator attached to the beam element, wherein the first actuator is capable of exerting a first force upon the beam element causing the beam element to move with respect to the axis, and wherein the first force is dependent upon the analog input signal provided to the isolated-ADC;
 a sensor communicating with the beam element to detect a change in position of the beam element and to produce a position signal indicative of the position of the beam element; and
 a second actuator attached to the beam element, wherein the second actuator is capable of exerting a second force upon the beam element based upon a feedback signal;
a comparator electrically coupled to the sensor, wherein the comparator generates a digital signal based upon a comparison of the position signal with a reference value representative of a reference position of the beam element; and
a digital-to-analog converter (DAC) electrically coupled between the second actuator and the comparator, wherein the DAC generates the feedback signal at least in partial dependence upon the digital signal;

wherein the digital output signal is further produced by a processing device within the isolated-ADC in dependence upon the digital signal, the digital output signal being an indication of, and electrically isolated from, the analog input signal.

2. The isolated-ADC of claim 1, wherein each of the first and second actuators is selected from the group consisting of: a Lorentz force motor, an electrostatic motor, a piezoelectric motor, a thermal-expansion motor, and a mechanical-displacement motor.

3. The isolated-ADC of claim 1, wherein the sensor is selected from the group consisting of a capacitive sensor, a piezoelectric sensor, a photoelectric sensor, a resistive sensor, and an optical switching sensor.

4. The isolated-ADC of claim 1, wherein the comparator is a single-bit analog-to-digital converter that outputs a high value when the position signal exceeds the reference value and otherwise outputs a low value.

5. The isolated-ADC of claim 1, wherein the processing device includes a digital filter and a decimator that generate the digital output signal based upon the digital signal.

6. The isolated-ADC of claim 5, wherein the digital signal is a bit stream and the digital output signal is a serial number indicative of a magnitude of the analog input signal.

7. The isolated-ADC of claim 1, wherein the DAC is a single-bit DAC.

8. The isolated-ADC of claim 1, wherein the beam element is a beam attached to the substrate for sliding motion along the axis, wherein the axis is parallel to an adjacent surface of the substrate, and wherein at least a portion of the beam element between the first actuator and the sensor is an electrical insulator to electrically isolate the first actuator from the sensor.

9. The isolated-ADC of claim 1, wherein the MEMS further includes a damping element.

10. The isolated-ADC of claim 1, wherein the comparator, the DAC and the processing device are all implemented on an application specific integrated circuit (ASIC) chip.

11. The isolated-ADC of claim 1, wherein at least one of:
at least one of the actuators comprises more than one actuator element, and
the sensor comprises more than one sensor element.

12. An isolated-ADC providing isolation between an analog input signal and a digital output signal, the isolated-ADC comprising:
a microelectromechanical system (MEMS) including:
a substrate;
a beam element supported from the substrate for movement with respect to an axis relative to the substrate;
a first actuator attached to the beam element, wherein the first actuator is capable of exerting a first force upon the beam element causing the beam element to move with respect to the axis, and wherein the first force is dependent upon the analog input signal provided to the isolated-ADC;
a sensor communicating with the beam element to detect a change in position of the beam element and to produce a position signal indicative of the position of the beam element; and
a second actuator attached to the beam element, wherein the second actuator is capable of exerting a second force upon the beam element based upon a first feedback signal;
a comparator electrically coupled to the sensor, wherein the comparator generates a digital signal based upon a comparison of the position signal with a reference value representative of a reference position of the beam element; and
a differentiator electrically coupled to the comparator, wherein the differentiator generates an intermediate signal related to a derivative of the digital signal;

wherein the first feedback signal includes at least one of a first analog signal component based upon the intermediate signal and a second analog signal component based upon the digital signal; and wherein the digital output signal is further produced by a processing device within the isolated-ADC in dependence upon the digital signal, the digital output signal being an indication of, and electrically isolated from, the analog input signal.

13. The isolated-ADC of claim 12, wherein each of the first and second actuators is selected from the group consisting of: a Lorentz force motor, an electrostatic motor, a piezoelectric motor, a thermal-expansion motor, and a mechanical-displacement motor.

14. The isolated-ADC of claim 12, wherein the sensor is selected from the group consisting of a capacitive sensor, a piezoelectric sensor, a photoelectric sensor, a resistive sensor, and an optical switching sensor.

15. The isolated-ADC of claim 12, wherein the comparator is a single-bit analog-to-digital converter that outputs a high value when the position signal exceeds the reference value and otherwise outputs a low value.

16. The isolated-ADC of claim 12, wherein the processing device includes a digital filter and a decimator that generate the digital output signal based upon the digital signal.

17. The isolated-ADC of claim 16, wherein the digital signal is a bit stream and the digital output signal is a serial number indicative of a magnitude of the analog input signal.

18. The isolated-ADC of claim 12, wherein the beam element is a beam attached to the substrate for sliding motion along the axis, wherein the axis is parallel to an adjacent surface of the substrate, and wherein at least a portion of the beam element between the first actuator and the sensor is an electrical insulator to electrically isolate the first actuator from the sensor.

19. The isolated-ADC of claim 12, wherein the MEMS further includes a damping element.

20. The isolated-ADC of claim 12, wherein the differentiator digitally differentiates the digital signal and multiplies it by a factor to obtain the intermediate signal.

21. The isolated-ADC of claim 20, wherein the factor is one, and wherein the multiple of the digital signal is one times the digital signal.

22. The isolated-ADC of claim 12, further comprising
an adder coupled to the differentiator and to the comparator, wherein the adder generates a sum signal that is the sum of the intermediate signal and a multiple of the digital signal; and
a digital-to-analog converter (DAC) electrically coupled between the second actuator and the adder, wherein the DAC generates the feedback signal based upon the sum signal such that the feedback signal includes both the first analog signal component based upon the intermediate signal and the second analog signal component based upon the digital signal.

23. The isolated-ADC of claim 22, wherein the DAC is a two-bit DAC.

24. The isolated-ADC of claim 22, wherein the comparator, the differentiator, the adder, the DAC and the processing device are all implemented on a single application specific integrated circuit (ASIC) chip.

25. The isolated ADC of claim 12, further comprising
a first digital-to-analog converter (DAC) electrically coupled to the differentiator, wherein the first DAC converts the intermediate signal into the first analog signal component; and
a second DAC electrically coupled to the comparator, wherein the second DAC converts the digital signal into the second analog signal component.

26. The isolated ADC of claim 25, further comprising an adder coupled between the second actuator and the first and second DACs,
wherein the adder sums the first and second analog signal components to generate the first feedback signal such that the first feedback signal includes both the first and second analog signal components, and
wherein each of the first and second DACs are single-bit DACs.

27. The isolated ADC of claim 25, wherein the MEMS further includes a third actuator attached to the beam element, wherein the third actuator is capable of exerting a third force upon the beam element based upon a second feedback signal, wherein the first feedback signal is the first analog signal component and the second feedback signal is the second analog signal component, and wherein each of the first and second DACs are single-bit DACs.

28. An isolated-ADC providing isolation between an analog input signal and a digital output signal, the isolated-ADC comprising:
a microelectromechanical system (MEMS) including:
a substrate;
a beam element supported from the substrate for movement with respect to an axis relative to the substrate;
a first actuator attached to the beam element, wherein the first actuator is capable of exerting a first force upon the beam element causing the beam element to move with respect to the axis, and wherein the first force is dependent upon the analog input signal provided to the isolated-ADC;
a sensor communicating with the beam element to detect a change in position of the beam element and to produce a position signal indicative of the position of the beam element; and
a second actuator attached to the beam element, wherein the second actuator is capable of exerting a second force upon the beam element based upon a feedback signal;
a set of comparators including at least first, second and third comparators that are each electrically coupled to the sensor,
wherein the first comparator generates a first digital signal based upon a comparison of the position signal with a reference value representative of a reference position of the beam element;
wherein the second comparator generates a second digital signal based upon a comparison of the position signal with a first offset value representative of a first reference position offset of the beam element; and
wherein the third comparator generates a third digital signal based upon a comparison of the position signal with a second offset value representative of a second reference position offset of the beam element;
a logical decision device coupled to the first, second and third comparators, wherein the logical decision device generates a feedback bitstream signal that is based on at least the first, second and third digital signals; and
a digital-to-analog converter (DAC) electrically coupled between the second actuator and the logical decision device, wherein the DAC generates the feedback signal in dependence upon the feedback bitstream signal;
wherein the digital output signal is further produced by the isolated-ADC in dependence upon at least one of the first, second and third digital signals, the digital output signal being an indication of, and electrically isolated from, the analog input signal.

29. The isolated-ADC of claim 28, wherein each of the first and second actuators is selected from the group consisting of: a Lorentz force motor, an electrostatic motor, a piezoelectric motor, a thermal-expansion motor, and a mechanical-displacement motor.

30. The isolated-ADC of claim 28, wherein the sensor is selected from the group consisting of a capacitive sensor, a piezoelectric sensor, a photoelectric sensor, a resistive sensor, and an optical switching sensor.

31. The isolated-ADC of claim 28, wherein the first comparator is a single-bit analog-to-digital converter that outputs a high value when the position signal exceeds the reference value and otherwise outputs a low value.

32. The isolated-ADC of claim 28, further comprising a processing device coupled to the first comparator, the processing device including a digital filter and a decimator that generate the digital output signal based upon the first digital signal.

33. The isolated-ADC of claim 32, wherein the digital signal is a bit stream and the digital output signal is a serial number indicative of a magnitude of the analog input signal.

34. The isolated-ADC of claim 28, wherein the DAC is a single-bit DAC.

35. The isolated-ADC of claim 28, wherein the beam element is a beam attached to the substrate for sliding motion along the axis, wherein the axis is parallel to an adjacent surface of the substrate, and wherein at least a portion of the beam element between the first actuator and the sensor is an electrical insulator to electrically isolate the first actuator from the sensor.

36. The isolated-ADC of claim 28, wherein the MEMS further includes a damping element.

37. The isolated-ADC of claim 28, wherein the first, second and third comparators, the logical decision device, the DAC, and a processing device employed to generate the digital output signal are all implemented on an application specific integrated circuit (ASIC) chip.

38. The isolated-ADC of claim 28, wherein each of the first and second actuators is a Lorentz force motor; wherein the sensor is selected from the group consisting of a capacitive sensor, a piezoelectric sensor, a photoelectric sensor, a resistive sensor, and an optical switching sensor; and wherein the Lorentz force motor that is the second actuator is capable of being positioned electrically in series with Lorentz force motors of a plurality of additional actuators of other MEMS devices.

39. The isolated-ADC of claim 38, wherein the first offset value is reset after each occurrence of the position signal changing from being below the reference value to being above the reference value, and wherein the second offset value is reset after each occurrence of the position signal changing from being above the reference value to below the reference value.

40. The isolated-ADC of claim 28, wherein the set of comparators includes at least one additional comparator that is electrically coupled to the sensor, wherein the at least one additional comparator generates at least one additional digital signal based upon a comparison of the position signal with at least one additional offset value representative of at least one additional reference position offset of the beam element, wherein the logical decision device is coupled to the at least one additional comparator and generates the feedback bitstream signal based at least in part upon the at least one additional digital signal.

41. The isolated-ADC of claim 40, wherein the at least one additional comparator includes a fourth comparator and a fifth comparator, wherein the at least one additional offset value includes a third offset value that is provided to the fourth comparator and a fourth offset value that is provided to the fifth comparator, wherein the third offset value is at a higher level than the first offset value and the fourth offset value is at a lower level than the second offset value, wherein the fourth comparator generates a fourth digital signal based upon a comparison of the position signal with the third offset value and the fifth comparator generates a fifth digital signal based upon a comparison of the position signal with the fourth offset value, and wherein the logical decision device is able to determine a quantity related to a slope of the position signal based upon the first, second, third, fourth and fifth digital signals.

42. An isolated-ADC providing isolation between an analog input signal and a digital output signal, the isolated-ADC comprising:
 a microelectromechanical system (MEMS) including:
  a substrate;
  a beam element supported from the substrate for movement with respect to an axis relative to the substrate;
  a first actuator attached to the beam element, wherein the first actuator is capable of exerting a first force upon the beam element causing the beam element to move with respect to the axis, and wherein the first force is dependent upon the analog input signal provided to the isolated-ADC;
  a sensor communicating with the beam element to detect a change in position of the beam element and to produce a position signal indicative of the position of the beam element; and
  a second actuator attached to the beam element, wherein the second actuator is capable of exerting a second force upon the beam element based upon a feedback signal;
 a differential amplifier electrically coupled to the sensor, wherein the differential amplifier generates two intermediate signals based upon a comparison of the position signal with a reference value representative of a reference position of the beam element;
 a comparator bias circuit including a comparator that receives the two intermediate signals and in response generates a digital signal; and
 a digital-to-analog converter (DAC) electrically coupled between the second actuator and the comparator bias circuit, wherein the DAC generates the feedback signal dependent upon the digital signal,
 wherein the digital output signal is further produced by the isolated-ADC in dependence upon the digital signal, the digital output signal being an indication of, and electrically isolated from, the analog input signal.

43. The isolated-ADC of claim 42, wherein the comparator bias circuit includes first, second and third pairs of resistors and two capacitors, wherein the two intermediate signals are provided to high and low inputs of the comparator within the comparator bias circuit by way of the two resistors of the first pair of resistors, wherein the comparator within the comparator bias circuit outputs high and low output signals, wherein the high output signal is the digital signal and is further coupled to the low input by way of the two resistors of the second pair of resistors, wherein the low output signal is coupled to the high input by way of the two resistors of the third pair of resistors, wherein the high output signal is further coupled to a junction between the two resistors of the third pair of resistors, and wherein the low output signal is further coupled to a junction between the two resistors of the second pair of resistors.

44. The isolated-ADC of claim 42, wherein the comparator bias circuit includes first, second and third pairs of resistors and two capacitors, wherein the two intermediate signals are provided to high and low inputs of the comparator within the comparator bias circuit by way of the two resistors of the first pair of resistors, wherein the comparator within the comparator bias circuit outputs high and low output signals, wherein the high output signal is the digital signal and is further coupled to the low input by way of the two resistors of the second pair of resistors, wherein the low output signal is coupled to the high input by way of the two resistors of the third pair of resistors, wherein a first of the two capacitors is coupled between a junction between the two resistors of the third pair of resistors and a ground, and wherein a second of the two capacitors is coupled between a junction between the two resistors of the second pair of resistors and the ground.

45. The isolated-ADC of claim 42, wherein the DAC is a single-bit DAC.

46. The isolated-ADC of claim 42, wherein each of the first and second actuators is selected from the group consisting of: a Lorentz force motor, an electrostatic motor, a piezoelectric motor, a thermal-expansion motor, and a mechanical-displacement motor.

47. The isolated-ADC of claim 42, wherein the sensor is selected from the group consisting of a capacitive sensor, a piezoelectric sensor, a photoelectric sensor, a resistive sensor, and an optical switching sensor.

48. The isolated-ADC of claim 42, further comprising a processing device including a digital filter and a decimator that generate the digital output signal based upon the digital signal.

49. The isolated-ADC of claim 42, wherein the digital signal is a bit stream and the digital output signal is a serial number indicative of a magnitude of the analog input signal.

50. The isolated-ADC of claim 42, wherein at least one of:
 at least one of the actuators comprises more than one actuator element, and
 the sensor comprises more than one sensor element.

51. The isolated-ADC of claim 42, wherein the beam element is a beam attached to the substrate for sliding motion along the axis, wherein the axis is parallel to an adjacent surface of the substrate, and wherein at least a portion of the beam element between the first actuator and the sensor is an electrical insulator to electrically isolate the first actuator from the sensor.

52. The isolated-ADC of claim 42, wherein the MEMS further includes a damping element.

53. The isolated-ADC of claim 42, wherein the differential amplifier, the comparator bias circuit, the DAC, and a processing device employed to generate the digital output signal are all implemented on an application specific integrated circuit (ASIC) chip.

54. An isolated-ADC providing isolation between an analog input signal and a digital output signal, the isolated-ADC comprising:

a microelectromechanical system (MEMS) including:
  a substrate;
  a beam element supported from the substrate for movement with respect to an axis relative to the substrate;
  a first actuator attached to the beam element, wherein the first actuator is capable of exerting a first force upon the beam element causing the beam element to move with respect to the axis, and wherein the first force is dependent upon the analog input signal provided to the isolated-ADC;
  a sensor communicating with the beam element to detect a change in position of the beam element and to produce a position signal indicative of the position of the beam element;
  a second actuator attached to the beam element, wherein the second actuator is capable of exerting a second force upon the beam element based upon a feedback signal; and
  a damping element coupled to the beam element, wherein the damping element tends to generate a third force when the beam element moves, the third force tending to counter the at least one of the first and second forces causing the movement;
  a first comparator electrically coupled to the sensor, wherein the first comparator generates a first digital signal based upon a comparison of the position signal with a reference value representative of a reference position of the beam element; and
  a digital-to-analog converter (DAC) electrically coupled between the first comparator and the second actuator, wherein the DAC generates the feedback signal in dependence upon the first digital signal;
wherein the digital output signal is further produced by the isolated-ADC in dependence upon the first digital signal, the digital output signal being an indication of, and electrically isolated from, the analog input signal.

55. The isolated-ADC of claim 54, further comprising a differentiator and an adder, wherein the differentiator differentiates the digital signal to produce an intermediate signal, and wherein the adder sums the intermediate signal and the digital signal and provides a result to the DAC.

56. The isolated-ADC of claim 54, further comprising
  second and third comparators that are each electrically coupled to the sensor,
    wherein the second comparator generates a second digital signal based upon a comparison of the position signal with a first offset value representative of a first reference position offset of the beam element; and
    wherein the third comparator generates a third digital signal based upon a comparison of the position signal with a second offset value representative of a second reference position offset of the beam element; and
  a logical decision device coupled to the first, second and third comparators, wherein the logical decision device generates a feedback bitstream signal that is based on at least the first, second and third digital signals, wherein the feedback bitstream signal is provided to the DAC.

57. The isolated-ADC of claim 56, further comprising a differential amplifier and a comparator bias circuit that includes the comparator, wherein the differential amplifier is coupled between the sensor and the comparator bias circuit.

58. An isolated-ADC comprising:
  a microelectromechanical means for adding an analog input signal to a feedback signal and producing a position signal in response to the analog input and feedback signals;
  a means for generating a digital output signal based upon the position signal; and
  a means for generating the feedback signal based upon the position signal;
  wherein, the digital output signal is electrically isolated from the analog input signal.

59. A method of providing a digital output signal based upon an analog input signal, wherein the digital output signal is electrically isolated from the analog input signal, the method comprising:
  receiving the analog input signal at a first actuator of a microelectromechanical system (MEMS);
  receiving a feedback signal at a second actuator of the MEMS;
  generating movement of a beam element of the MEMS by way of the first and second actuators in response to the respective analog input and feedback signals;
  sensing a position of the beam element of the MEMS at a sensor of the MEMS;
  comparing the sensed position with a reference value;
  generating a first digital signal in response to the comparing of the position and the reference value, wherein the first digital signal is at a high level while the sensed position is determined to be greater than the reference value and at a low level while the sensed position is determined to be less than the reference value;
  generating, based upon the first digital signal, both the digital output signal and the feedback signal.

60. The method of claim 59, further comprising differentiating the first digital signal to produce an intermediate signal upon which the feedback signal is based.

61. The method of claim 59, wherein the digital output signal is determined from the digital signal by way of a digital filter and a decimator, and wherein the digital output signal is a serial number indicative of the analog input signal.

62. The method of claim 59, further comprising:
  comparing the sensed position with a first offset value, and with a second offset value;
  generating second and third digital signals in response to the comparing of the position with the first and second offset values, respectively, wherein the first, second and third digital signals are respectively at high levels while the sensed position is determined to be greater than the reference value, the first offset value and the second offset value, and wherein the first, second and third digital signals are respectively at low levels while the sensed position is determined to be less than the reference value, the first offset value and the second offset value;
  processing at a logical decision device the first, second and third digital signals to obtain a feedback bitstream signal;
  generating the feedback signal from the feedback bitstream signal by way of a digital-to-analog converter (DAC).

63. The method of claim 62, further comprising:
  setting the first offset value equal to the position upon the occurrence of a period following a time at which the position changes from being below the reference value to being above the reference value; and
  setting the second offset value equal to the position upon the occurrence of the first period following a time at which the position changes from being above the reference value to being below the reference value.

64. The method of claim 61, further comprising:
comparing the sensed position with a plurality of offset values at a plurality of respective comparators;
generating a plurality of additional digital signals in response to the comparing of the position with the plurality of offset values, respectively;
processing at a logical decision device the first digital signal and the plurality of additional digital signals to obtain a feedback bitstream signal;
generating the feedback signal from the feedback bitstream signal by way of a digital-to-analog converter (DAC).

65. The method of claim 61, wherein each of the first and second actuators is a Lorentz force motor, and wherein the sensor is selected from the group consisting of a capacitive sensor, a piezoelectric sensor, a photoelectric sensor, a resistive sensor, and an optical switching sensor.

66. The method of claim 61, wherein each of the first and second actuators is selected from the group consisting of: a Lorentz force motor, an electrostatic motor, a piezoelectric motor, a thermal-expansion motor, and a mechanical-displacement motor, and wherein the sensor is selected from the group consisting of a capacitive sensor, a piezoelectric sensor, a photoelectric sensor, a resistive sensor, and an optical switching sensor.

67. A method of providing a digital output signal based upon an analog input signal, wherein the digital output signal is electrically isolated from the analog input signal, the method comprising:
receiving the analog input signal at a first actuator of a microelectromechanical system (MEMS);
receiving a first feedback signal at a second actuator of the MEMS;
generating movement of a beam element of the MEMS by way of the first and second actuators in response to the respective analog input and first feedback signals;
sensing a position of the beam element of the MEMS at a sensor of the MEMS;
comparing the sensed position with a reference value;
generating a first digital signal in response to the comparing of the position and the reference value, wherein the first digital signal is at a high level while the sensed position is determined to be greater than the reference value and at a low level while the sensed position is determined to be less than the reference value;
generating the digital output signal based upon the first digital signal; and
differentiating the first digital signal to obtain an intermediate signal, wherein the first feedback signal is based upon at least one of the intermediate signal and the first digital signal.

68. The method of claim 67, wherein the intermediate signal is added to a multiple of the first digital signal to produce a digital sum signal, and the digital sum signal is converted into the first feedback signal by way of a two-bit digital-to-analog converter (DAC).

69. The method of claim 67, wherein the intermediate signal and the first digital signal are respectively converted into first and second analog signal components by respective single-bit digital-to-analog converters (DAC), and wherein the first and second analog signal components are added at a summing device to produce the first feedback signal.

70. The method of claim 67, wherein the intermediate signal and the first digital signal are respectively converted into first and second analog signal components by respective digital-to-analog converters (DAC), wherein the first feedback signal is based upon the first analog signal component, wherein the second analog signal component is provided as a second feedback signal to a third actuator, and wherein the third actuator affects the movement of the beam element in response to the second feedback signal.

71. The method of claim 70, wherein each of the DACs is a single-bit DAC.

72. A method of providing a digital output signal based upon an analog input signal, wherein the digital output signal is electrically isolated from the analog input signal, the method comprising:
receiving the analog input signal at a first actuator of a microelectromechanical system (MEMS);
receiving a feedback signal at a second actuator of the MEMS;
generating movement of a beam element of the MEMS by way of the first and second actuators in response to the respective analog input and feedback signals;
sensing a position of the beam element of the MEMS at a sensor of the MEMS;
comparing the sensed position with a reference value and a plurality of offset values at a plurality of respective comparators;
generating a first digital signal in response to the comparing of the position and the reference value and a plurality of additional digital signals in response to the comparing of the position with the plurality of offset values, respectively;
generating the digital output signal based upon the first digital signal;
processing at a logical decision device the first digital signal and the plurality of additional digital signals to obtain a feedback bitstream signal;
generating the feedback signal from the feedback bitstream signal by way of a digital-to-analog converter (DAC).

73. A method of providing a digital output signal based upon an analog input signal, wherein the digital output signal is electrically isolated from the analog input signal, the method comprising:
receiving the analog input signal at a first actuator of a microelectromechanical system (MEMS);
receiving a feedback signal at a second actuator of the MEMS;
generating movement of a beam element of the MEMS by way of the first and second actuators in response to the respective analog input and feedback signals;
sensing a position of the beam element of the MEMS at a sensor of the MEMS;
providing an indication of the sensed position and a reference value to a differential amplifier;
providing two intermediate signals from the differential amplifier to a comparator bias circuit;
generating a digital signal at the comparator bias circuit based upon the high and low output signals; and
generating, based upon the digital signal, both the digital output signal and the feedback signal.

74. The method of claim 73, wherein the comparator bias circuit includes first, second and third pairs of resistors and two capacitors, wherein the two intermediate signals are provided to high and low inputs of the comparator within the comparator bias circuit by way of the two resistors of the first pair of resistors, wherein the comparator within the comparator bias circuit outputs high and low output signals, wherein the high output signal is the digital signal and is further coupled to the low input by way of the two resistors of the second pair of resistors, wherein the low output signal is coupled to the high input by way of the two resistors of the third pair of resistors.

75. The method of claim 74 wherein the high output signal is further coupled to a junction between the two resistors of the third pair of resistors by a first of the two capacitors, and wherein the low output signal is further coupled to a junction between the two resistors of the second pair of resistors by a second of the two capacitors.

76. The method of claim 74, wherein a first of the two capacitors couples a junction between the two resistors of the third pair of resistors to a ground, and a second of the two capacitors couples a junction between the two resistors of the second pair of resistors to the ground, and wherein the feedback signal is generated from the digital signal by way of a digital-to-analog converter (DAC).

77. A method of providing a digital output signal based upon an analog input signal, wherein the digital output signal is electrically isolated from the analog input signal, the method comprising:
  receiving the analog input signal at a first actuator of a microelectromechanical system (MEMS);
  receiving a feedback signal at a second actuator of the MEMS;
  generating movement of a beam element of the MEMS by way of the first and second actuators in response to the respective analog input and feedback signals;
  damping the movement of the beam element of the MEMS by way of a damping element;
  sensing a position of the beam element of the MEMS at a sensor of the MEMS;
  comparing the sensed position with a reference value;
  generating a digital signal in response to the comparing of the position and the reference value, wherein the digital signal is at a high level while the sensed position is determined to be greater than the reference value and at a low level while the sensed position is determined to be less than the reference value;
  determining the digital output signal based upon the digital signal; and
  generating the feedback signal based upon the digital signal.

78. The method of claim 77, wherein beam element is a beam and the damping element includes a wire in which is induced a current when movement of the beam occurs, wherein the induced current produces a magnetic field that tends to counteract the movement of the beam.

79. The method of claim 77, wherein the damping element includes at least one of a control device to control the induced current and another type of control device.

* * * * *